US008826092B2

(12) United States Patent
Berry, Jr. et al.

(10) Patent No.: US 8,826,092 B2
(45) Date of Patent: Sep. 2, 2014

(54) CHARACTERIZATION AND VALIDATION OF PROCESSOR LINKS

(75) Inventors: Robert W. Berry, Jr., Round Rock, TX (US); Anand Haridass, Bangalore (IN); Prasanna Jayaraman, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 13/281,081

(22) Filed: Oct. 25, 2011

(65) Prior Publication Data

US 2013/0103927 A1 Apr. 25, 2013

(51) Int. Cl.
G06F 11/00 (2006.01)
G01R 31/319 (2006.01)
G06F 11/22 (2006.01)

(52) U.S. Cl.
CPC .......... G01R 31/31926 (2013.01); G06F 11/22 (2013.01)
USPC ........... 714/738; 375/224; 702/107; 702/117; 702/118; 702/120; 702/182; 702/186; 714/724; 714/735; 714/736; 714/739; 712/30; 712/E9.02

(58) Field of Classification Search
None
See application file for complete search history.

(56) References Cited

U.S. PATENT DOCUMENTS

| 6,484,282 | B1 * | 11/2002 | Tsuto ............................. | 714/738 |
| 6,704,277 | B1 | 3/2004 | Dabral et al. .................. | 370/201 |
| 6,735,543 | B2 * | 5/2004 | Douskey et al. .............. | 702/120 |
| 6,980,601 | B2 * | 12/2005 | Jones ............................. | 375/261 |
| 6,986,087 | B2 | 1/2006 | Laake et al. .................. | 714/724 |
| 7,082,385 | B2 * | 7/2006 | Hsu et al. ...................... | 702/186 |
| 7,233,875 | B2 * | 6/2007 | Huang ........................... | 702/117 |
| 7,287,205 | B2 | 10/2007 | Lin et al. ........................ | 714/738 |
| 7,400,173 | B1 | 7/2008 | Kwong et al. .................. | 326/86 |
| 7,512,186 | B2 * | 3/2009 | Jones ............................. | 375/260 |
| 7,587,651 | B2 | 9/2009 | Kuo ............................... | 714/745 |
| 7,656,181 | B2 | 2/2010 | Kim et al. ................. | 324/762.02 |
| 7,853,843 | B2 | 12/2010 | Hsu et al. ...................... | 714/724 |
| 8,018,989 | B2 * | 9/2011 | Nygaard et al. .............. | 375/224 |
| 8,570,881 | B2 * | 10/2013 | Talbot et al. .................. | 370/252 |
| 2002/0106010 | A1 * | 8/2002 | Jones ............................. | 375/219 |
| 2003/0125897 | A1 * | 7/2003 | Higashide ..................... | 702/118 |
| 2004/0006729 | A1 | 1/2004 | Pendurkar ..................... | 714/733 |
| 2004/0044938 | A1 * | 3/2004 | Heo ............................... | 714/738 |

(Continued)

OTHER PUBLICATIONS

'Test Pattern Generation using Boolean Proof Engines' by Drechsler et al., coypright 2009 by Springer Science+Business Media B.V.*

(Continued)

Primary Examiner — Steven Snyder
(74) Attorney, Agent, or Firm — DeLizio Gilliam, PLLC

(57) ABSTRACT

A processor link that couples a first processor and a second processor is selected for validation and a plurality of communication parameter settings associated with the first and the second processors is identified. The first and the second processors are successively configured with each of the communication parameter settings. One or more test data pattern(s) are provided from the first processor to the second processor in accordance with the communication parameter setting. Performance measurements associated with the selected processor link and with the communication parameter setting are determined based, at least in part, on the test data pattern as received at the second processor. One of the communication parameter settings that is associated with the highest performance measurements is selected. The selected communication parameter setting is applied to the first and the second processors for subsequent communication between the first and the second processors via the processor link.

8 Claims, 8 Drawing Sheets

(56) References Cited

U.S. PATENT DOCUMENTS

| | | | |
|---|---|---|---|
| 2004/0047408 A1 | 3/2004 | Koenenkamp et al. | 375/224 |
| 2004/0123204 A1* | 6/2004 | Grimes et al. | 714/738 |
| 2005/0119860 A1* | 6/2005 | Hsu et al. | 702/186 |
| 2005/0276343 A1* | 12/2005 | Jones | 375/260 |
| 2006/0190642 A1* | 8/2006 | Aldereguia et al. | 710/60 |
| 2007/0118321 A1* | 5/2007 | Huang | 702/117 |
| 2007/0230513 A1* | 10/2007 | Talbot et al. | 370/516 |
| 2008/0023700 A1 | 1/2008 | Gschwind | 257/48 |
| 2010/0095167 A1* | 4/2010 | Kotrla et al. | 714/705 |
| 2010/0309968 A1* | 12/2010 | Nygaard et al. | 375/224 |
| 2013/0103354 A1 | 4/2013 | Berry, Jr. et al. | 702/186 |

OTHER PUBLICATIONS

'Structured Computer Organization—Second Edition' by Tanenbaum, pp. 10-11, copyright 1984 by Prentice-Hall, Inc.*

"U.S. Appl. No. 14/084,797 Office Action", Jan. 2, 2014, 21 pages.

* cited by examiner

CHARACTERIZATION AND VALIDATION OF PROCESSOR LINKS

BACKGROUND

Embodiments of the inventive subject matter generally relate to the field of system validation and, more particularly, to characterization and validation of processor links.

A multi-processor system comprises multi-core central processing units (CPUs) in a single module. Typically, communication between the processors in the multi-processor system is via a high-speed inter-processor bus (also referred to as a processor link). The processors that are coupled via the processor link (i.e., a driver processor and a destination processor) are typically associated with I/O parameters that govern analog characteristics of a signal transmitted from the driver processor and the corresponding signal received at the destination processor. Characterizing the processor link during a testing/validation phase can help identify the best I/O parameters for reliably achieving desired performance levels.

SUMMARY

Various embodiments for characterizing high-speed communication links are disclosed. In one embodiment, a first of a plurality of processor links between a first and a second of a plurality of processors in a system is selected for validation. A plurality of communication parameter settings associated with the first and the second of the plurality of processors is identified. For each of the plurality of communication parameter settings, the first and the second of the plurality of processors are configured with the communication parameter setting that governs data communication from the first of the plurality of processors to the second of the plurality of processors via the first of the plurality of processor links. A test data pattern is provided, in accordance with the communication parameter setting, from the first of the plurality of processors to the second of the plurality of processors via the first of the plurality of processor links. A performance measurement associated with the first of the plurality of processor links and with the communication parameter setting is determined based, at least in part, on the test data pattern as received at the second of the plurality of processors. The performance measurements associated with each of the plurality of communication parameters settings are compared. A highest of the performance measurements is identified based on comparing the performance measurements associates with each of the plurality of communication parameters settings. The highest of the performance measurements was determined for a first of the plurality of communication parameter settings. The first of the plurality of communication parameter settings is applied to the first and the second of the plurality of processors for subsequent communication between the first and the second of the plurality of processors via the first of the plurality of processor links.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
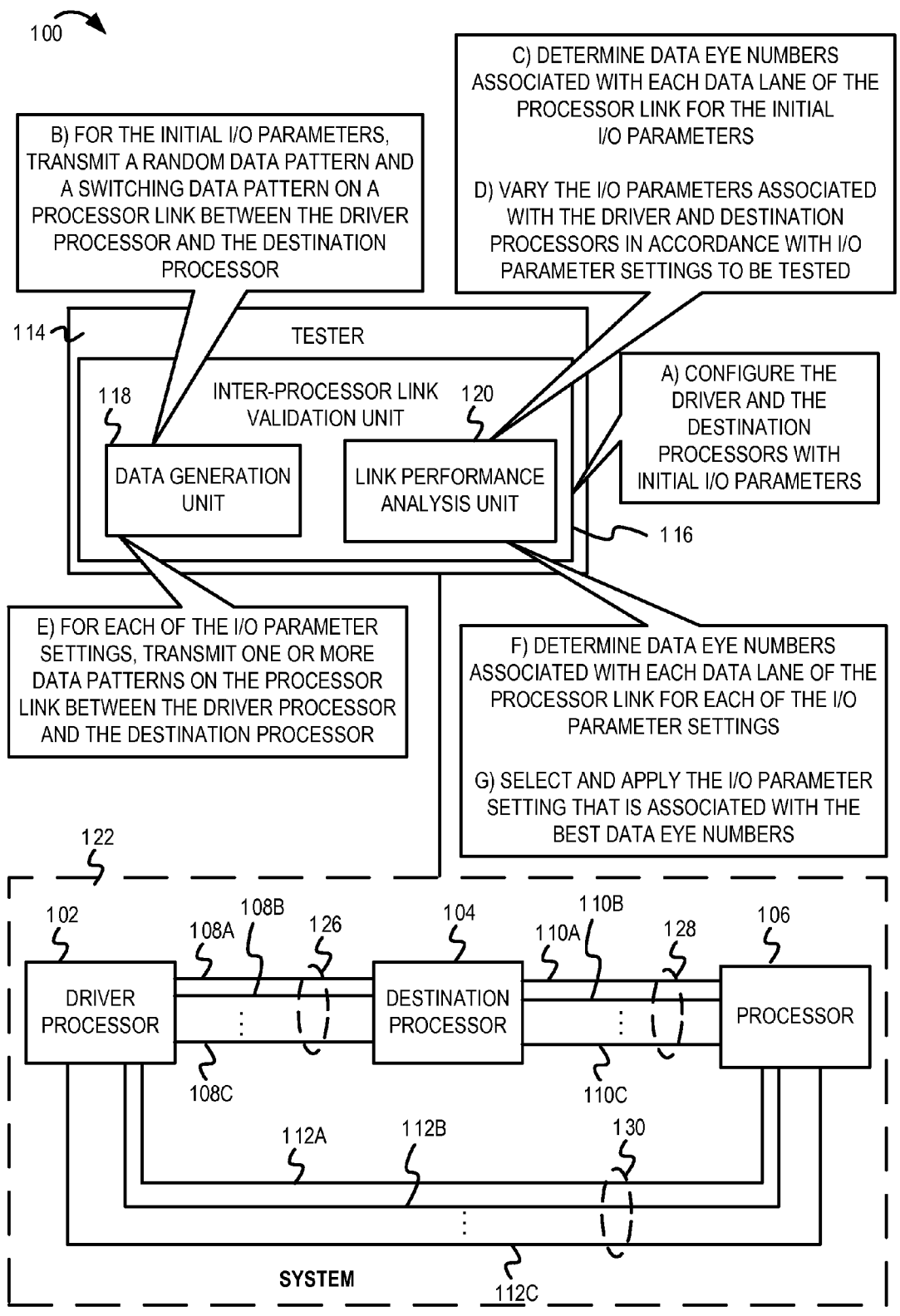
FIG. 1 is an example conceptual diagram illustrating a mechanism for selecting I/O parameters associated with a driver processor and a destination processor.

The description that follows includes exemplary systems, methods, techniques, instruction sequences and computer program products that embody techniques of the present inventive subject matter. However, it is understood that the described embodiments may be practiced without these specific details. For instance, although examples refer to characterizing processor links and isolating affinity between processor links in one multi-processor system, embodiments are not so limited. In other embodiments, the operations described herein can be executed for processor links that couple processors on different systems. In other embodiments, the operations described herein can be executed for any suitable high speed communication links, such as communication links between a processor and an application specific integrated circuit (ASIC). In other instances, well-known instruction instances, protocols, structures and techniques have not been shown in detail in order not to obfuscate the description.

A processor link between a driver processor and a destination processor can be analyzed during a system testing/validation phase for identifying the communication parameters associated with the driver processor and the destination processor and for ensuring reliable communication via the processor link. Existing techniques for characterizing the processor link and for identifying communication parameters for data communication between the driver processor and the destination processor ("existing processor link validation techniques") typically employ predetermined test data that are generated by an external emulator. The external emulator test data are stored in I/O buffers at the driver processor and transmitted via the processor link to the destination processor. The communication parameters of the driver processor and the destination processor are adjusted to achieve the best performance measurements. After the communication parameters are determined based on the external emulator test data, the system comprising the driver processor and the destination processor may be tested again in the actual (i.e., non-test) environment to validate the communication parameters, thus increasing the amount of time spent in testing/validation. The existing processor link validation techniques and consequently the communication parameters may also be limited by the predetermined test data generated by the external emulator and may not take into consideration the architecture (e.g., the operating system) and operation of the actual system. In other words, the existing processor link validation techniques typically retrieve predetermined test data from the external emulator and provide the predetermined test data to the physical layer for transmission via the processor link. Therefore, other functionality associated with the processor link such as data integrity protection mechanisms (e.g., the data inversion operations, scrambling operations, etc.) that are configured to minimize the probability of worst-case data communication scenarios on the processor link may not be taken into consideration. Furthermore, the existing processor link validation techniques also do not take into consideration changes in the processors' power profile that can affect the analog characteristics of the signal being transmitted/received via the processor link. Additionally, the existing processor link validation techniques typically test the processor links in a system on a link-by-link basis (e.g., by disabling other processor links that are not currently being tested). Therefore, interactions between processor links and the effect of one processor link on another processor link (e.g., inter-processor link interference) may not be taken into consideration by the existing processor link validation techniques.

An inter-processor link validation unit can be implemented in a testing environment to configure the processor links for reliable data communication between each pair of processors in a system. For each of the processor links, the inter-processor link validation unit can train the processor link (between a driver processor and a destination processor) and can identify one or more communication parameters associated with the driver processor and the destination processor. The inter-processor link validation unit can customize data patterns to create worst-case bit pattern scenarios and can transmit the customized data patterns generated by the application layer (or the operating system layer) to identify a communication parameter setting that can ensure successful operation of the processor link. For each communication parameter setting to be tested, a data pattern can be transmitted from the driver processor to the destination processor via the processor link. Performance measurements associated with the processor link and with the communication parameter setting can be determined based on the data pattern received at the destination processor. The performance measurements associated with each communication parameter setting can be compared to identify the communication parameter setting that is associated with the best performance measurements. The communication parameter setting with the best performance measurements can be applied to the driver processor and the destination processor for subsequent communication via the processor link. Additionally, the inter-processor link validation unit can also help isolate affinity (also known as crosstalk or interference) between processor links within the system. The inter-processor link validation unit can customize data patterns on a bit-by-bit basis and can transmit these customized data patterns on the processor links to identify and isolate data bit affinity. Such a technique for multi-processor system validation by forcing custom data patterns from the application/OS layer onto processor links can help enhance processor link training and re-training to combat performance degradation, isolate and minimize affinity/interference between processor links, and improve analog characteristics of physical layer signaling for better performance. This, in turn, can improve inter-processor communication performance and the overall performance of the system.

FIG. 1 is an example conceptual diagram illustrating a mechanism for selecting I/O parameters associated with a driver processor and a destination processor. FIG. 1 depicts a testing environment 100 that comprises a system 122 to be tested coupled with a tester 114. The tester 114 comprises an inter-processor link validation unit 116. The inter-processor link validation unit 116 comprises a data generation unit 118 and a link performance analysis unit 120. The system 122 comprises three processors 102, 104, and 106 that are coupled with each other via processor links. The processors 102 and 104 are coupled via processor link 126. The processors 104 and 106 are coupled via processor link 128. The processors 102 and 106 are coupled via processor link 130. Each of the processor links comprises a plurality of "data lanes." In FIG. 1, data lanes 108A, 108B, and 108C constitute the processor link 126 between the processor 102 and the processor 104. Data lanes 110A, 110B, and 110C constitute the processor link 128 between the processor 104 and the processor 106. Data lanes 112A, 112B, and 112C constitute the processor link 130 between the processor 102 and the processor 106. Each data lane can be a physical serial connection between two processors and the number of data lanes that constitute the processor link may be indicative of the number of bits that can be transmitted via the processor link per clock cycle. Thus, if the processor link 126 between the processors 102 and 104 comprises 16 data lanes, the processor link is a 16-bit inter-processor bus, and 16 bits can be transmitted via the processor link 126 per clock cycle. In other words, at the rising edge (or the falling edge) of the clock signal, each of the 16 bits can be mapped to corresponding each of the 16 data lanes of the processor link 126 for transmission from the processor 102 to the processor 104. In some implementations, each of the processor links 126, 128, and 130 can comprise the same number of data lanes. In other implementations, each of the processor links 126, 128, and 130 can comprise a different number of data lanes. In some implementations, a pair of processors may be coupled via only one processor link. In other implementations, a pair of processors can be coupled via any suitable number of processor links, and each of these processor links between the same pair of processors can comprise the same or different number of data lanes. Furthermore, it is noted that although FIG. 1 depicts three processors 102, 104, and 106 and three processor links 126, 128, and 130 between corresponding pairs of processors, the system 122 can comprise any suitable number of processors and processor links.

In some implementations, the processors 102, 104, and 106 may be associated with driver I/O parameters and receiver I/O parameters that govern analog characteristics of the signal transmitted from a driver processor (e.g., the driver processor 102) and analog characteristics of the signal received at a destination processor (e.g., the destination processor 104). However, as described above, the system 122 typically comprises one or more data integrity protection mechanisms for each of the processor links 126, 128, and 130 to enable error free data communication via the processor links. The data integrity protection mechanisms are implemented to reduce the likelihood of various issues (e.g., data switching at the driver processor, signal and data sampling at the destination processor) that can impact the integrity of the signals and data that are transmitted between processors via the processor link, cause the processor link to fail, and can consequently degrade system performance. The data integrity protection mechanisms can include mechanisms to scramble and de-scramble data (e.g., by XORing the data with a predetermined data pattern), data enhancement features to guard against worst-case data scenarios (e.g., worst-case data patterns) on the processor link, data inversion mechanisms that minimize simultaneous data switching, etc. The data integrity protection mechanisms are configured to statistically alter the traffic (i.e., data) generated by an application to reduce simultaneous switching or to ensure periodic transitions per bit. In statistically altering the traffic, the data transmitted via the physical (PHY) layer is different from the data that was generated by the application layer (or other functionality). Although the data integrity protection mechanisms can be defeated by very careful selection of the test data patterns, in some implementations, the data integrity protection mechanisms may be disabled for simplicity and for better control of the processor link. After the data integrity protection mechanisms associated with the processor links are disabled, the inter-processor link validation unit 116 can execute operations described below in stages A-G to analyze one or more I/O parameter settings for the driver processor and the destination processor and to select the I/O parameter settings that will yield the best performance of the processor link 126.

At stage A, the inter processor-link validation unit 116 configures the driver processor 102 and the destination processor 104 with initial I/O parameters. The I/O parameters can include a pre-compensation value, a clock peaking value, a data peaking value, a voltage reference, and other such I/O parameters that govern the analog characteristics of the signal transmitted by the driver processor 102 and the corresponding signal received by the destination processor 104. In some implementations, values of the initial I/O parameters can be predetermined and can indicate a base/reference value from which to begin analysis of the I/O parameters. In other implementations, the initial I/O parameter values may be the last determined values of the I/O parameters (e.g., if I/O parameter re-calibration operations are being executed). In another implementation, the initial I/O parameter values can be determined by simulating data communication via the processor link 126 between the driver processor 102 and the destination processor 104.

At stage B, the data generation unit 118 transmits, for the initial I/O parameters, a random data pattern and a switching data pattern on the processor link between the driver processor 102 and the destination processor 104. In some implementations, the data generation unit 118 can generate requisite data patterns by exchanging appropriate signals (e.g., using handshake mechanisms) with the operating system. The signals exchanged between the data generation unit and the operating system can comprise API calls based on the hardware architecture of the system 122. The data generation unit 118 may also execute bit masking functionality to configure the data pattern to be transmitted via the processor link on a bit-by-bit basis. For example, the data generation unit 118 may comprise a random number generator or a pseudo-random number generator, may generate a random (or pseudo-random) bit pattern, and may use an AND mask or an OR mask to force one or more individual bits of the generated random bit pattern to logic 0 or logic 1, as will be further described below.

To transmit the random data pattern via the processor link 126, the data generation unit 118 first generates a random data pattern that comprises a plurality of sub data patterns. Each of the sub data patterns comprises a plurality of data bits that is equal to the number of data lanes 108A-108C that constitute the processor link 126. For example, the random data pattern may comprise 50 sub data patterns. The processor link 126 between the driver processor 102 and the destination processor 104 may comprise 16 data lanes. In this example, each of the 50 sub data patterns may comprise 16 data bits. At each clock cycle, the data generation unit 118 may transmit one of the sub data patterns via the processor link 126 (i.e., via the data lanes 108A-108C). Thus, at the first clock cycle (e.g., at the rising clock edge or the falling clock edge), the data generation unit 118 can map the 16 bits of the first sub data pattern onto corresponding 16 data lanes of the processor link 126. At the second clock cycle, the data generation unit 118 can map the 16 bits of the second sub data pattern onto corresponding 16 data lanes of the processor link 126, and so on. The random data pattern is considered to be transmitted via the processor link 126 from the driver processor 102 to the destination processor 104 after 50 clock cycles elapse and after the data generation unit 118 has transmitted the 50 sub data patterns via the processor link 126. The data generation unit 118 can employ various other techniques for generating the random data pattern, as will be further described in block 308 of FIG. 3.

Likewise, the data generation unit 118 can also transmit a switching data pattern from the driver processor 102 to the destination processor 104 via the processor link 126. The switching data pattern can be generated by alternately transmitting data bits at logic zero and at logic one at consecutive clock cycles. For example, transmitting the switching data pattern via the data lane 108A comprises transmitting a data bit at logic zero during a first clock cycle, transmitting a data bit at logic one during a second clock cycle, transmitting a data bit at logic zero during a third clock cycle, and so on. It is noted that in other implementations, transmitting the switching data pattern via the data lane 108A can comprise transmitting a data bit at logic one during the first clock cycle, transmitting a data bit at logic zero during the second clock cycle, transmitting a data bit at logic one during the third clock cycle, and so on. The data generation unit 118 can employ various other techniques for generating the random data pattern, as will be further described in block 314 of FIG. 3. The data generation unit 118 can provide the requisite data patterns on the processor link 126 (e.g., a physical bus on the board between the driver processor 102 and the destination processor 104) by mapping the individual data bits of the data pattern onto appropriate data lanes 108A-108C of the processor link 126.

At stage C, the link performance analysis unit 120 determines data eye numbers associated with each data lane of the processor link for the initial I/O parameters. A data eye pattern (also known as a data eye diagram) is typically employed to estimate the performance of a communication link between a transmitting device (i.e., the driver processor 102) and a receiving device (i.e., the destination processor 104). The data eye pattern can be digitally measured at the destination processor 104 to estimate the performance of the processor link 126 between the driver processor 102 and the destination processor 104 and to assess the integrity of the signal received at the destination processor 104. Traditionally, the data eye pattern can be generated on an oscilloscope by sampling the signal received at the destination processor 104 and applying the sampled received signal to the oscilloscope's vertical input, while setting the horizontal sweep rate input of the oscilloscope to the data rate of the received signal. The link performance analysis unit 120 can sample the signal (comprising the data pattern transmitted at stage B) received at the destination processor 104 and can generate the data eye pattern. The link performance analysis unit 120 can analyze the data eye pattern to determine a data eye height, a data eye width, and other suitable values (referred to herein as "data eye numbers") that can be used to assess the integrity of the signal received via the processor link 126. Analysis of the data eye numbers can help the link performance analysis unit 120 identify the presence of signal distortion, interference, poor synchronization, and other data communication issues.

In some implementations, the link performance analysis unit 120 can intercept the received signal at the destination processor 104 and can determine the data eye numbers associated with the processor link 126 based on sampling the received signal. In another implementation, the destination processor 104 may comprise itself functionality to determine the data eye numbers associated with the processor link 126 based on sampling the received signal. Accordingly, the destination processor 104 may determine the data eye numbers associated with the processor link 126 and may provide the data eye numbers associated with the processor link 126 to the link performance analysis unit 120. In some implementations, the link performance analysis unit 120 may determine the data eye numbers associated with the processor link 126 based on the driver processor 102 transmitting (and the destination processor 104 receiving) both the random data pattern and the switching data pattern. In another implementation, the link performance analysis unit 120 may determine the data eye numbers associated with the processor link 126 based on the driver processor 102 transmitting (and the destination processor 104 receiving) only the random data pattern. In another implementation, the link performance analysis unit 120 may determine the data eye numbers associated with the processor link 126 based on the driver processor 102 transmitting (and the destination processor 104 receiving) only the switching data pattern. In other implementations, the link performance analysis unit 120 may determine the data eye numbers associated with the processor link 126 based on other suitable data patterns.

It is noted that in determining the data eye numbers associated with the processor link 126, the link performance analysis unit 120 determines the data eye numbers associated with each data lame 108A-108C of the processor link 126. As described above, the data generation unit 118 maps, at each clock cycle, a data bit of a sub data pattern onto a data lane of the processor link 126. Thus, in transmitting the random data pattern via the processor link 126, the data generation unit 118 transmits a plurality of data bits (e.g., equal to the number of sub data patterns) via each data lane of the processor link 126. At the destination processor 104, the data eye numbers associated with each of the data lanes 108A-108C can be determined based on the data bits transmitted via corresponding each of the data lanes 108A-108C. In some implementations, as will be described in FIGS. 3-4, the data eye numbers associated with each of the data lanes can be analyzed to identify the weakest data lane.

At stage D, the link performance analysis unit 120 varies the I/O parameters associated with the driver processor 102 and the destination processor 104 in accordance with I/O parameter settings to be tested. The link performance analysis unit 120 can identify the I/O parameter settings that are to be tested. The I/O parameters settings can comprise combinations of one or more I/O parameters of the driver processor and/or the destination processor that are to be tested. For example, the link performance analysis unit 120 may determine to test two values of driver I/O parameter A (A1, A2) and two values of destination I/O parameter B (B1, B2) to identify the best combination of I/O parameters for the driver processor and the destination processor. If A0 and B0 are the initial values of the I/O parameters, the link performance analysis unit 120 can determine to analyze one or more of the following I/O parameter settings: (A0, B1), (A0, B2), (A1, B0), (A1, B1), (A1, B2), (A2, B0), (A2, B1), and (A2, B2).

At stage E, the data generation unit 118 transmits for each of the I/O parameter settings to be tested, one or more data patterns on the processor link 126 between the driver processor 102 and the destination processor 104. The data generation unit 118 can generate and transmit a random data pattern, a switching data pattern, an all-zero ("quiet") data pattern, and/or other suitable data patterns on the data lanes 108A-108C that constitutes the processor link 126, as will be described below in blocks 320 and 322 of FIG. 4.

At stage F, the link performance analysis unit 120 determines data eye numbers associated with each data lane 108A-108C of the processor link 126 for each of the I/O parameter settings. For each of the data lanes 108A-108C, the link performance analysis unit 120 determines the data eye numbers associated with the data lane based on the data bits received at the destination processor 104 from the driver processor 102, as described above in stage C and as will be described in blocks 320 and 322 of FIG. 4.

At stage G, the link performance analysis unit 120 selects and applies the I/O parameters of the I/O parameter setting that is associated with the best data eye numbers. As will be further described in blocks 324 and 326 of FIG. 4, the link performance analysis unit 120 compares the data eye numbers associated with the processor link 126 for each of the I/O parameter settings. In some implementations, the link performance analysis unit 120 can determine (for each I/O parameter setting) the average of the data eye numbers associated with the data lanes 108A-108C. The link performance analysis unit 120 can compare the average of the data eye numbers associated with the I/O parameter settings. The link performance analysis unit 120 can select the I/O parameter setting that is associated with the largest average data eye numbers. In another implementation, the link performance analysis unit 120 can select the I/O parameter setting that is associated with the largest data eye numbers on a majority of the (e.g., at least N) data lanes. The I/O parameters of the driver processor 102 and the receiver processor 104 can then be configured in accordance with the selected I/O parameter setting.

Figure 2:
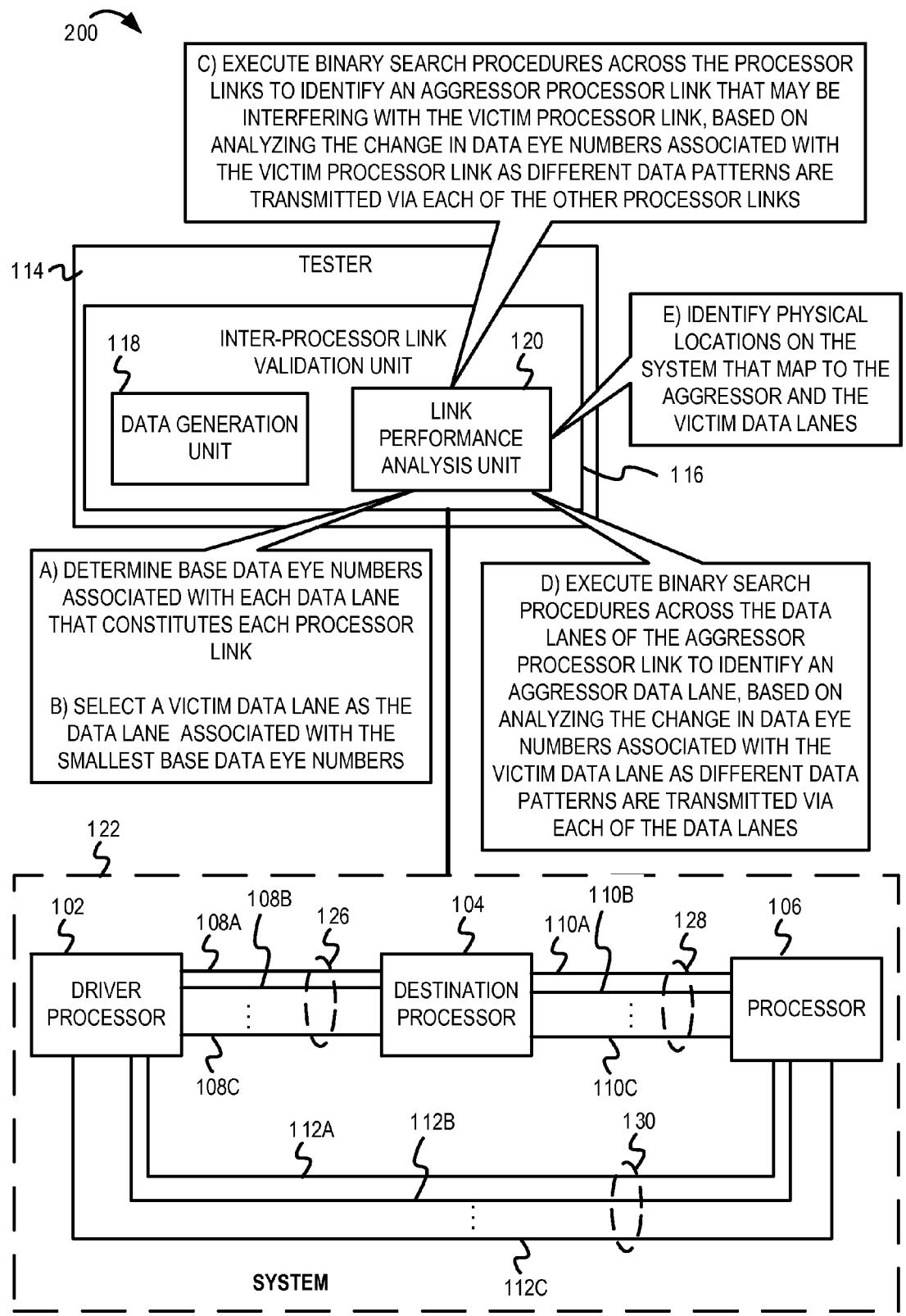
FIG. 2 is an example conceptual diagram illustrating a mechanism for identifying and minimizing crosstalk across processor links.

FIG. 2 is an example conceptual diagram illustrating a mechanism for identifying and minimizing crosstalk across processor links. FIG. 2 depicts a testing environment 200 comprising the system 122 of FIG. 1 coupled with the tester 114 of FIG. 1. As described above with reference to FIG. 1, the system 122 comprises three processors 102, 104, and 106. Each processor is coupled with every other processor of the system 122 via processor links and each processor link comprises a plurality of data lanes. Furthermore, as described above with reference to FIG. 1, the tester 114 comprises the inter-processor link validation unit 116 which, in turn, comprises the data generation unit 118 and the link performance analysis unit 120. As described above with reference to FIG. 1, the data generation unit 118 transmits a random data pattern, a quiet data pattern, a switching data pattern and/or other suitable data pattern on each data lane of each of the processor links to facilitate calculation of data eye numbers associated with each of the data lanes. The link performance analysis unit 120 can execute operations described below in stages A-E to identify processor links and data lanes that interfere with each other, to minimize interference on/between processor links, and to improve inter-processor communication performance.

At stage A, the link performance analysis unit 120 determines base data eye numbers associated with each data lane that constitutes each processor link. The data generation unit 118 transmits a random data pattern via each of the data lanes 108A-108C, 110A-110C, and 112A-112C that constitute corresponding processor links 126, 128, and 130. The link performance analysis unit 120 determines base data eye numbers associated with each of the data lanes based on sampling the random data pattern received at the appropriate destination processors, as will be described with reference to block 502 of FIG. 5.

At stage B, the link performance analysis unit 120 selects a weakest data lane as the data lane that is associated with the smallest base data eye numbers. In some implementations, the link performance analysis unit 120 can compare the base data eye numbers associated with each of the data lanes 108A-108C, 110A-110C, and 112A-112C and can select a data lane (e.g., the data lane 108A) that is associated with the smallest base data eye numbers. The selected weakest data lane 108A is herein referred to as the "victim data lane." In some implementations, the link performance analysis unit 120 can designate the processor link 126 that comprises the victim data lane as the weakest processor link or the "victim processor link." As will be further described in block 504 of FIG. 5, the link performance analysis unit 120 can employ other suitable techniques to identify the victim processor link 126 and the victim data lane 108A. It is noted that in some implementations, as will be described below in blocks 506-514 of FIG. 5, data eye numbers associated with the victim data lane 108A may be determined based on transmitting a quiet data pattern (and/or a switching data pattern) on all the other data lanes while transmitting a random data pattern on the victim data lane 108A. These data eye numbers can be compared against the base data eye numbers associated with the victim data lane 108A to infer (or to confirm) the presence of interference on the victim data lane 108A due to one or more other data lanes.

At stage C, the link performance analysis unit 120 executes binary search procedures across the processor links to identify an aggressor processor link that may be interfering with the victim processor link 126, based on analyzing the change in data eye numbers associated with the victim processor link 126 as different data patterns are transmitted via each of the other processor links 128 and 130. Excluding the victim processor link 126, the data generation unit 118 transmits a quiet data pattern on half of the other processor links and a switching data pattern on the other half of the processor links. The data generation unit 118 transmits a random data pattern on the victim processor link 126. The link performance analysis unit 120 determines data eye numbers associated with the victim data lane 108A (or the victim processor link 126). The link performance analysis unit 120 compares the determined data eye numbers against the corresponding base data eye numbers determined at stage A. If the data eye numbers determined at stage C exceed the corresponding base data eye numbers determined at stage A, the link performance analysis unit 120 determines that the interference on the victim processor link 126 is being caused by a processor link on which the quiet data pattern was transmitted. However, if the data eye numbers determined at stage C are approximately equal to or less than the corresponding base data eye numbers determined at stage A, the link performance analysis unit 120 determines that the interference on the victim processor link 126 is being caused by a processor link on which the switching data pattern was transmitted. The link performance analysis unit 120 the selects (for analysis during the next iteration) the subset of the processor links that was deemed to interfere with the victim processor link 126. At each iteration, the link performance analysis unit 120 in conjunction with the data generation unit 118 successively executes the above-described operations on smaller and smaller subsets of the other (non-victim) processor links to zero in on the processor link ("aggressor processor link") that is potentially interfering with the victim processor link 126. Operations for identifying the aggressor processor link (e.g., the processor link 130) will be described in more detail in blocks 516-528 in FIG. 6.

At stage D, the link performance analysis unit 120 executes binary search procedures across the data lanes of the aggressor processor link 130 to identify an aggressor data lane, based on analyzing the change in data eye numbers associated with the victim data lane as different data patterns are transmitted via each of the data lanes of the aggressor processor link 130. The data generation unit 118 transmits a quiet data pattern on half of the data lanes that constitute the aggressor processor link 130 and a switching data pattern on the other half of the data lanes that constitute the aggressor processor link 130. The data generation unit 118 can transmit a random data pattern on all the other data lanes that do not constitute the aggressor processor link 130. The link performance analysis unit 120 determines data eye numbers associated with the victim data lane 108A. The link performance analysis unit 120 compares the data eye numbers determined at stage D against the corresponding base data eye numbers determined at stage A. If the data eye numbers determined at stage D exceed the corresponding base data eye numbers, the link performance analysis unit 120 determines that the interference on the victim data lane 108A is being caused by a data lane of the aggressor processor link 130 on which the quiet data pattern was transmitted. However, if the data eye numbers are approximately equal to or less than the corresponding base data eye numbers, the link performance analysis unit 120 determines that the interference on the victim data lane 108A is due to a data lane of the aggressor processor link 130 on which the switching data pattern was transmitted. The link performance analysis unit 120 selects (for analysis during a next iteration) the subset of data lanes of the aggressor processor link 130 that were deemed to interfere with the victim data lane 108A. At each iteration, the link performance analysis unit 120 in conjunction with the data generation unit 118 executes the above-described operations on smaller and smaller subsets of the data lanes of the aggressor processor link 130 to zero in on the data lane ("aggressor data lane") that is interfering with the victim data lane 108A. Operations for identifying the aggressor processor lane (e.g., the data lane 130C) will further be described in block 530 in FIG. 7.

At stage E, the link performance analysis unit 120 identifies physical locations on the system 122 that map to the aggressor data lane 130C and the victim data lane 108A. As will be further described in block 532 of FIG. 7, the link performance analysis unit 120 identifies physical constructs or a physical arrangement of components of the system 122 that may be linked to the affinity between the aggressor data lane 130C and the victim data lane 108A. For example, the link performance analysis unit 120 can determine that the aggressor data lane 130C interferes with the victim data lane 108A because the aggressor data lane 130C is in close proximity to the victim data lane 108A on the circuit board (or at the pin/connector level, at the package level, etc.).

Figure 3:
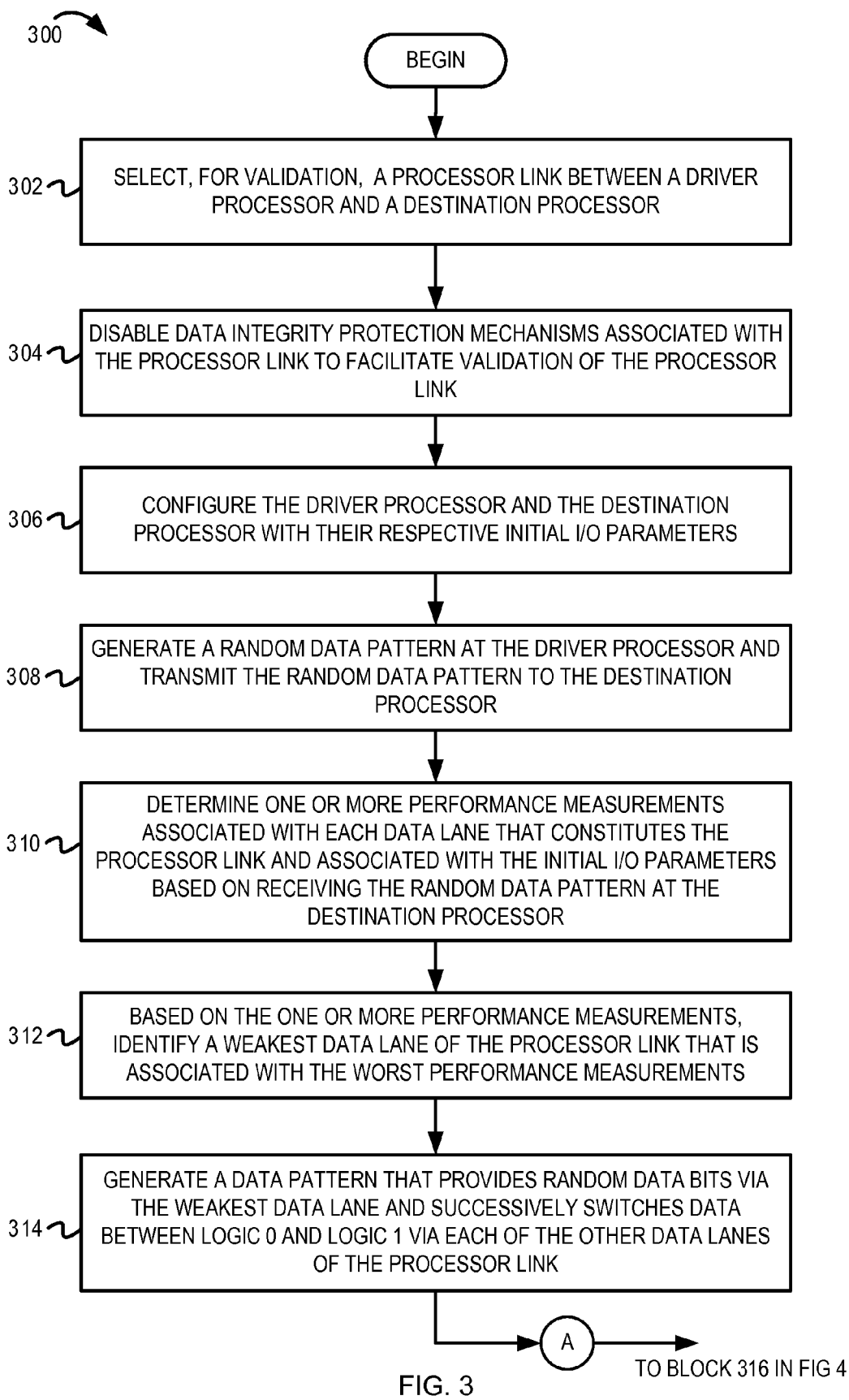
FIG. 3 is a flow diagram illustrating example operations for selecting I/O parameters associated with a driver processor and a destination processor.
Figure 4:
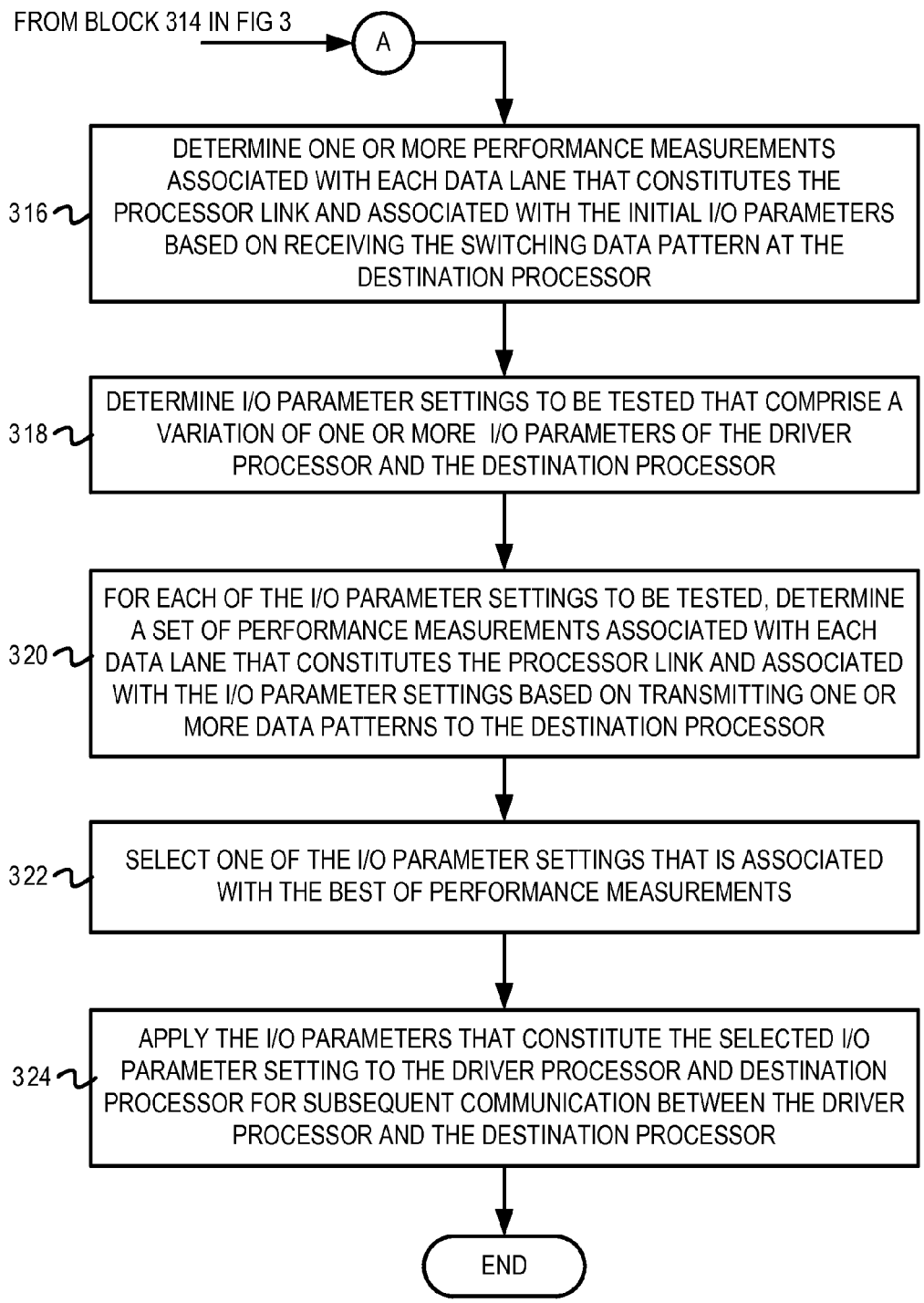
FIG. 4 is a continuation of FIG. 3 and illustrates example operations for selecting I/O parameters associated with the driver processor and the destination processor.

FIG. 3 and FIG. 4 depict a flow diagram ("flow") 300 illustrating example operations for selecting I/O parameters associated with a driver processor and a destination processor. The flow 300 begins at block 302 in FIG. 3.

A processor link between a driver processor and a destination processor is selected for validation (block 302). As depicted with reference to FIG. 1, the system 122 comprises multiple processors 102, 104, and 106 and each pair of processors is coupled by a processor link. One of the processor links (e.g., the processor link 126 between the driver processor 102 and the destination processor 104) can be selected for analysis to identify suitable I/O parameters for data communication via the processor link 126, as will be further described below. It is noted that while the processor link 126 is being validated in accordance with the operations described below, the other processor links 128 and 130 may not be disabled. Random (or predetermined) data patterns may be transmitted via the other processor links 128 and 130 to ensure that the processor link 126 is validated in the presence of other active processor links 128 and 130. Validating the processor link 126 in the presence of enabled/active processor links 128 and 130 can ensure that the I/O parameters (determined as the result of the validation operations) take into consideration interference (if any) between the processor link 126 and one or more of the other processor links 128 and 130. The flow continues at block 304.

Data integrity protection mechanisms associated with the processor link are disabled to facilitate validation of the processor link (block 304). As described above with reference to FIG. 1, the processor link 126 between the driver processor 102 and the destination processor 104 is typically associated with scrambling mechanisms, descrambling mechanisms, bit inversion mechanisms, and other such data integrity protection mechanisms that are designed to prevent/minimize worst-case data communication scenarios (e.g., transmission of bit patterns that can cause a high bit error rate) and to safeguard the processor link 126. These data integrity protection mechanisms, however, make it difficult to test these worst-case data communication scenarios during the validation phase. Therefore, prior to initiating the processor link validation operations, the data integrity protection mechanisms can be disabled to ensure successful testing/validation of the processor link 126 and to ensure that the processor link 126 has been validated against the worst-case data communication scenarios. Ensuring that the communication path between the driver processor 102 and the destination processor 104 is "clean" and free from any functionality that can alter the generated data pattern can enable the processor link 126 to be validated against the worst-case data communication scenarios. The flow continues at block 306.

The driver processor and the destination processor are configured with their respective initial I/O parameters (block 306). As described above, the I/O parameters can include a pre-compensation value, a clock peaking value, a data peaking value, a voltage reference, and other such I/O parameters that govern the analog characteristics of the signal transmitted by the driver processor 102 and the corresponding signal received by the destination processor 104. The initial I/O parameters can be predetermined values or may be determined based on simulations of data communication via the processor link 126 between the driver processor 102 and the destination processor 104. The flow continues at block 308.

A random data pattern is generated at the driver processor and is transmitted to the destination processor via the processor link (block 308). As depicted in FIG. 1, the processor link 126 comprises a plurality of data lanes 108A-108C. Each of the data lanes 108A-108C represents a physical serial connection between the driver processor 102 and the destination processor 104. At each clock cycle, a data bit can be transmitted via each data lane from the driver processor 102 to the destination processor 104. In transmitting a random data pattern via the processor link at block 308, a random data pattern is transmitted via each of the data lanes 108A-108C that constitute the processor link 126. The length of the random data pattern can be selected based, at least in part, on a number of clock cycles (i.e., the time interval) for which the processor link 126 should be stressed before determining the performance measurements. The random data pattern can comprise sub data patterns, each of which are transmitted at every clock cycle. For example, it may be determined that the random data pattern should be transmitted for 50 clock cycles. Accordingly, the random data pattern can comprise 50 sub data patterns and each of the sub data patterns can be transmitted during a clock cycle (e.g., at a rising edge or a falling edge of the clock). The number of data bits per sub data pattern may be determined based on the number of data lanes that constitute the processor link 126. For example, if the processor link 126 comprises 64 data lanes 108A-108C, each of the 50 sub data patterns can comprise 64 data bits. In some implementations, the random data pattern may be generated using an N-bit (in this example, a 64-bit) random (or a pseudo random) number generator. The random number generator may generate 50 such 64-bit random numbers and each of the 64-bit random numbers may be transmitted via the processor link 126 per clock cycle. In other words, at each clock cycle, each of the 64 bits of a random number may be mapped to corresponding 64 data lanes of the processor link 126 for transmission to the destination processor 104. In another implementation, the random data pattern may be generated using a 2N-bit (in this example, a 128-bit) random (or a pseudo random) number generator. The 128-bit random number generator may generate one 128-bit random number that may be repeated to generate the random data pattern. Thus, the first 64-bits of the 128-bit random number may be transmitted via respective 64 data lanes of the processor link 126 during the first clock cycle, the last 64-bits of the 128-bit random number may be transmitted during the second clock cycle, the first 64-bits of the 128-bit random number may be transmitted again during the third clock cycle, and so on. After the random data pattern is transmitted via the processor link 126, the flow continues at block 310.

One or more performance measurements associated with each data lane that constitutes the processor link and associated with the initial I/O parameters are determined based on receiving the random data pattern at the destination processor (block 310). The one or more performance measurements can include a data eye width, a data eye height, and other suitable data eye numbers that can be used to assess the integrity of each data lane 108A-108C that constitutes the processor link 126. As described above, a data bit is transmitted via each data lane that constitutes the processor link 126 at each clock cycle. After a random data pattern is transmitted for a predetermined number of clock cycles, a plurality of data bits have been transmitted from the driver processor 102 to the destination processor 104 via each data lane. For example, if a data bit is transmitted (per clock cycle) on each data lane, then after 50 clock cycles 50 data bits will have been transmitted via each data lane. For each data lane, the data bits received on the data lane can be combined to generate the data eye pattern and to determine the data eye numbers associated with the data lane. The data eye numbers associated with each of the data lanes are also associated with the initial I/O parameters (configured for the driver processor 102 and the destination processor 104 at block 306). The flow continues at block 312.

Based on the one or more performance measurements, a weakest data lane of the processor link is identified as the data lane that is associated with the worst performance measurements (block 312). In some implementations, the data eye numbers associated with each of the data lanes (determined above at block 310) can be compared against each other and the data lane with the smallest data eye numbers can be selected as the weakest data lane. In another implementation, a subset of the data lanes that are associated with data eye numbers that fall below a threshold data eye number may be selected as the weakest data lanes. For example, it may be determined that the data eye width associated with data lanes 4, 5, 10, and 17 are below a threshold data eye width. Accordingly, the data lanes 4, 5, 10, and 17 may be selected as the weakest data lanes. In another implementation, a subset of the data lanes that are associated with data eye numbers that are X % below the highest data eye number may be selected as the weakest data lanes. For example, the data eye widths associated with the data lanes may be compared to identify the largest data eye width (or the average eye width). It may be determined that the data eye width associated with data lanes 4, 5, 10, and 17 are 30% below the largest (or average) data eye width. Accordingly, the data lanes 4, 5, 10, and 17 may be selected as the weakest data lanes. In another implementation, a subset of the data lanes that are associated with data eye numbers that are within X % of the lowest data eye number may be selected as the weakest data lanes. For example, the data eye numbers associated with the data lanes may be compared to identify that data lane 4 is associated with the smallest data eye width. It may be determined that the data eye width associated with data lanes 5, 10, and 17 are within 10% of the smallest data eye width. Accordingly, the data lanes 4, 5, 10, and 17 may be selected as the weakest data lanes. The flow continues at block 314.

A data pattern is that provides random data bits via the weakest data lane and data bits that successively switch between logic 0 and logic 1 via each of the other data lanes of the processor link (block 314). In other words, a random data pattern can be provided via the weakest data lane and switching data patterns can be provided via the other data lanes that constitute the processor link. In some implementations, such a data pattern may be generated by first generating a random data pattern that is twice the size of the physical bus (i.e., the number of data lanes that constitute the processor link) to enable data bit switching at consecutive clock cycles, as will be described below. For example, if the processor link 126 comprises N data lanes, a 2N-bit random number may be generated. The data bits that correspond to the weakest data lane(s) may be identified. For example, if data lane 4 was deemed to be the weakest data lane, the $4^{th}$ bit and the $(N+4)^{th}$ bit may be identified (from the 2N-bit random number) as the data bits that correspond to the weakest data lane. The data bits that correspond to the weakest data lane may not be modified to ensure that the random data pattern is transmitted via the weakest data lane. The data bits that map to the other data lanes may be modified so that data bits at logic zero and logic one are alternately transmitted during consecutive clock cycles. The modified 2N-bit random number may be repeated for a predetermined number of clock cycles (as described above with reference to block 308). For example, if the processor link comprises 4 data lanes, an 8-bit random number say, 01101111 may be generated. If the $3^{rd}$ data lane was deemed the weakest data lane, data bits 3 and 7 may not be modified. Bits 1 and 5, bits 2 and 6, and bits 4 and 8 may be analyzed to determine whether (and to ensure that) the bits 1, 2, and 4 are complements of corresponding bits 5, 6, and 8. Bit masking operations (e.g., using an AND bit mask, an OR bit mask, etc.) can be executed on the 8-bit random number depending on whether a particular data bit should be at logic zero or at logic one. For example, the output of the random number generator (01101111) can be subject to an AND mask 01111011 to yield the resultant data pattern 01101011. As depicted by the resultant data pattern, the data bits 1, 2, and 4 are the complements of bits 5, 6, and 8 respectively. Therefore, during consecutive clock cycles, the data lanes 1, 2, and 4 will comprise alternate zeros and ones. More specifically, with reference to data lane 1, data bit 1 at logic zero is transmitted during the first clock cycle, data bit 5 at logic one is transmitted during the second clock cycle, data bit 1 at logic zero is transmitted again during the third clock cycle, and so on. In some implementations, each data bit of the 2N-bit random number may be analyzed to determine whether a particular data bit should be at logic zero or at logic one and the data bit can be switched accordingly. In another implementation, a predetermined 00001111 AND bit mask and a 00001110 OR bit mask may be applied to the 2N-bit random number to produce a switching data pattern on all of the data lanes. The predetermined AND bit mask and the OR bit mask can be updated depending on the knowledge of the data bits that map to the weakest data lane. For example, if bits 1 and 5 map to the weakest data lane, the AND bit mask can be updated to 1001111 (i.e., an input data bit when ANDed with a logic one data bit yields the same input data bit) and the OR bit mask can be updated to 00000111 (i.e., an input data bit when ORed with a logic zero data bit yields the same input data bit). It is noted that in other implementations, a data pattern of any suitable length can be determined, each data bit of the random number may be analyzed and toggled as desired, and the random number can be repeatedly transmitted via the processor link (if necessary) for a predetermined number of clock cycles. The flow continues at block 316 in FIG. 4.

One or more performance measurements associated with each data lane that constitutes the processor link and associated with the initial I/O parameters are determined based on receiving the switching data pattern on the non-weak data lanes at the destination processor (block 316 in FIG. 4). As described above, the performance measurements can include a data eye width, a data eye height, and other suitable data eye numbers that can be used to assess the integrity of each data lane that constitutes the processor link 126. In some implementations, the data eye numbers associated with all of the data lanes that constitute the processor link 126 can be determined. In another implementation, only the data eye numbers associated with the weakest data lanes (identified at block 312 of FIG. 3) may be determined. The data eye numbers associated with the weakest data lanes when a random data pattern is transmitted via the other data lanes (determined at block 310) can be compared against the data eye numbers associated with the weakest data lanes when a switching data pattern is transmitted via the other data lanes (determined at block 314) to detect the presence of crosstalk on the weakest data lanes. For example, if there is a difference (e.g., an X % difference) in the data eye numbers associated with the weakest data lane depending on whether a random data pattern or a switching data pattern is transmitted via the other (non-weak) data lanes, this can indicate the presence of interference on the weakest data lanes due to one or more other data lanes. As will be described below, the operations of FIGS. 5-7 can be executed to identify which of the other data lanes are interfering with the weakest data lane. The flow continues at block 318.

I/O parameter settings to be tested are determined (block 318). Each of the I/O parameter settings to be tested can comprise a variation of one or more I/O parameters of the driver processor and the destination processor. For example, five pre-compensation values (at the driver processor) and six reference voltage values (at the destination processor) may need to be tested to determine the best pre-compensation and reference voltage values for communication via the processor link 126. In some implementations, all possible combinations of the I/O parameters may be tested to identify the best I/O parameters for communication via the processor link 126. Thus, with reference to the above example, thirteen I/O parameter settings may be determined as thirteen possible combinations (including combinations with the initial values) of the pre-compensation and the voltage reference values. All of the thirteen I/O parameter settings may be analyzed (as will be described below) to identify the best I/O parameter setting for communication via the processor link 126. In another implementation, only a subset of the I/O parameter settings may be tested to identify the best I/O parameters for communication via the processor link 126. In other words, based on knowledge of the interaction between two or more of the I/O parameters, their influence on each other, and their influence on the performance of the processor link, a subset of the I/O parameter settings that may not substantially affect the performance of the processor link can be discarded. Only the subset of the I/O parameter settings that are most likely to affect the performance (e.g., the data eye numbers) of the processor link may be analyzed. The flow continues at block 320.

For each of the I/O parameter settings to be tested, a set of performance measurements associated with each data lane that constitutes the processor link and associated with the I/O parameter settings are determined (block 320). After the I/O parameter settings to be tested are identified (at block 316), the I/O parameters of the driver processor and the destination processor are varied in accordance with the first I/O parameter settings. A random data pattern (as described in block 308) may be transmitted on all the data lanes that constitute the processor link 126 between the driver processor 102 and the destination processor 104. In response to receiving the random data pattern at the destination processor 104, performance measurements (for the first I/O parameter settings) associated with each of the data lanes can be determined as described above with reference to block 310. In some implementations, a switching data pattern (as described above in block 314) may also be transmitted on those data lanes that were not selected as the weakest data lanes while a random data pattern may be transmitted on the weakest data lanes. In response to receiving the switching test pattern at the destination processor 104, performance measurements (for the first I/O parameter settings) associated with each of the data lanes are determined as described above with reference to block 316. It is noted that the performance measurements associated with each I/O parameter setting may be determined based on transmitting the random data pattern, the switching data pattern, and/or other suitable data patterns via each of the data lanes. In some implementations, the random data pattern may be transmitted via the weakest data lane irrespective of the data patterns transmitted via the other data lanes. After the performance measurements for the first I/O parameter setting are determined, the I/O parameters of the driver processor and the destination processor can be updated in accordance with the next I/O parameter setting and performance measurements associated with each of the data lanes (for the next I/O parameter setting) can be determined. The flow continues at block 322.

One of the I/O parameter settings that is associated with the best performance measurements is selected (block 322). In some implementations, the I/O parameter setting that yields the best data eye numbers across all of the data lanes can be selected. In another implementation, the I/O parameter setting that yields the best data eye numbers across a majority of the data lanes can be selected. In some implementations, the average of the data eye numbers (across all of the constituent data lanes can be calculated for each I/O parameter setting. The average data eye numbers associated with the I/O parameter settings can be compared and the I/O parameter setting that is associated with the largest average data eye numbers can be selected. In some implementations, the I/O parameter setting that yields the largest data eye numbers associated with the weakest data lane can be selected. The flow continues at block 324.

The I/O parameters that constitute the selected I/O parameter setting are applied to the driver processor and the destination processor for subsequent communication between the driver processor and the destination processor (block 322). In some implementations, after the I/O parameters that constitute the selected I/O parameter setting are applied to the driver processor and the destination processor, the data integrity protection mechanisms (previously disabled at block 304) can be enabled. The system 122 can then be subject to other forms of testing/validation and/or can be deployed in the actual non-test environment. From block 324, the flow ends.

In addition to identifying the I/O parameters for reliable data communication on the processor link between the driver processor and the destination processor, functionality can also be executed to isolate and minimize crosstalk (or affinity) between processor links and/or between data lanes, as will be described below in FIGS. 5-7.

Figure 5:
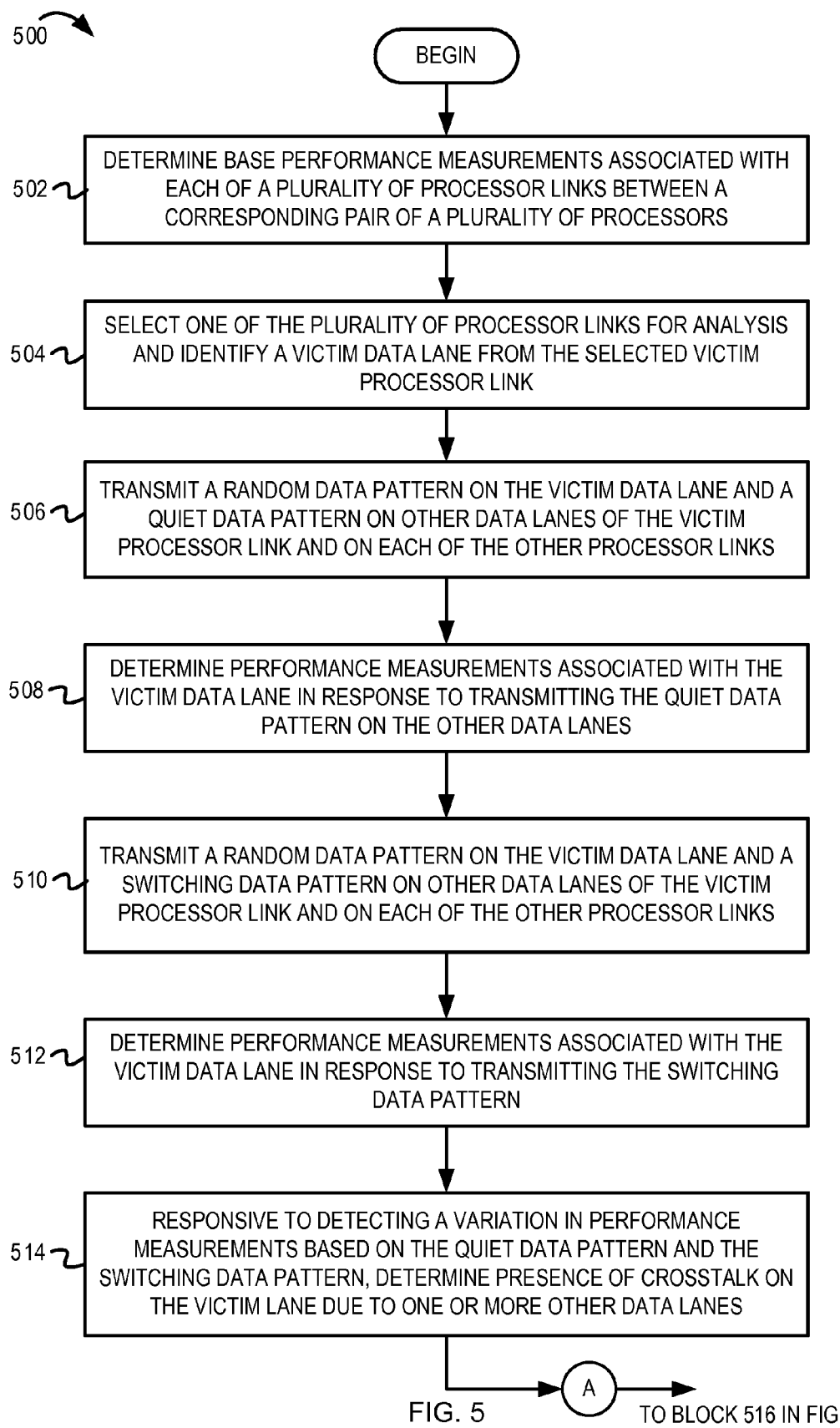
FIG. 5 is a flow diagram illustrating example operations for identifying and minimizing crosstalk across processor links.
Figure 6:
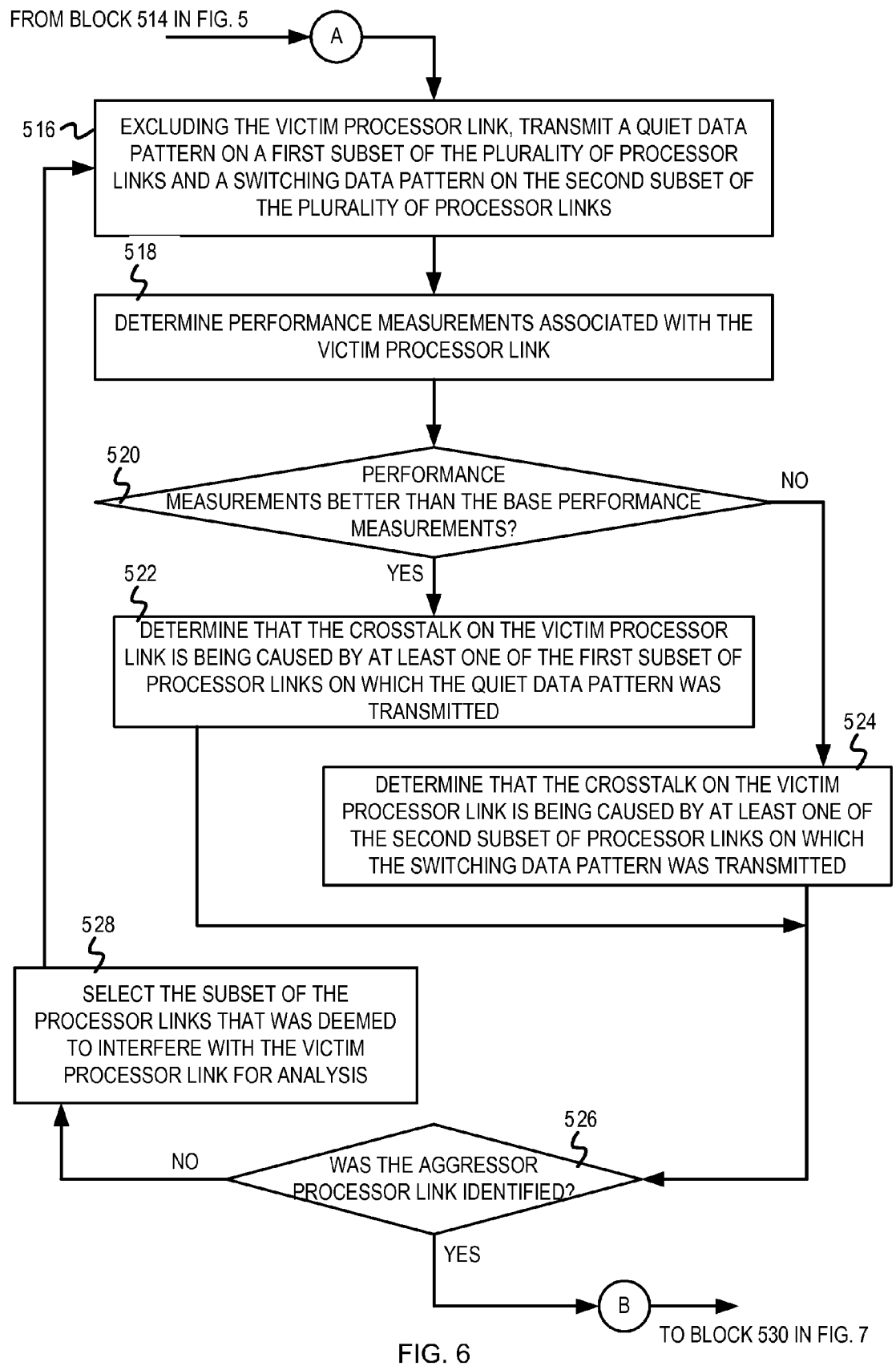
FIG. 6 is a continuation of FIG. 5 and illustrates example operations for identifying and minimizing crosstalk across processor links.
Figure 7:
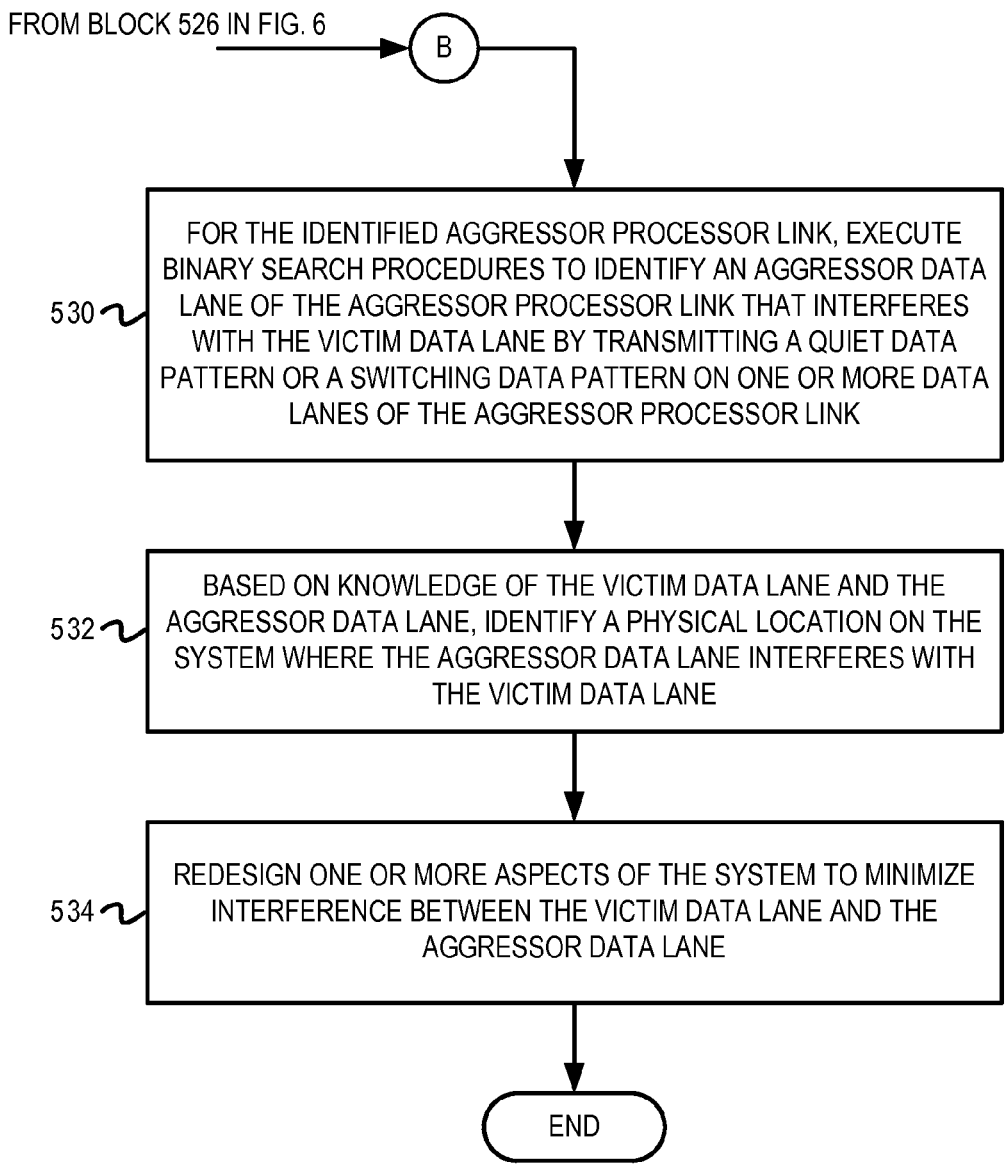
FIG. 7 is a continuation of FIG. 6 and illustrates example operations for identifying and minimizing crosstalk across processor links.

FIG. 5, FIG. 6, and FIG. 7 depict a flow diagram illustrating example operations for identifying and minimizing crosstalk across processor links. Flow 500 begins at block 502 in FIG. 5.

Base performance measurements associated with each of a plurality of processor links between a corresponding pair of a plurality of processors are determined (block 502). As depicted with reference to FIG. 1, the system 122 comprises multiple processors 102, 104, and 106, each pair of processors is coupled by a processor link, and each processor link comprises a plurality of data lanes. For example, a system may comprise N processor links and each of the N processor links may comprise M data lanes. At block 502, a random data pattern is transmitted across each of the N processor links (i.e., each of the M data lanes of each of the N processor links). Based on receiving the random data pattern at the destination processor, base performance measurements associated with each of the (N*M) data lanes can be determined. The base performance measurements can include a data eye height, a data eye width, or other suitable data eye numbers that indicate the integrity of data communication across each of the data lanes. Furthermore, in some implementations, data integrity protection mechanisms associated with all of the processor links may also be disabled prior to transmitting the random test pattern via all of the processor links, as described above with reference to block 304 in FIG. 3. The flow continues at block 504.

One of the plurality of processor links is selected for analysis and a weakest data lane associated with the selected processor link is identified (block 504). In some implementations, the performance measurements (e.g., the data eye numbers) associated with all of the data lanes can be compared and at least one data lane that is associated with the weakest performance measurements (e.g., smallest data eye numbers) can be selected. The data lane that is associated with the smallest data eye numbers can be designated as the victim data lane. The processor link that comprises the victim data lane can be designated as the victim processor link. In another implementation, average performance measurements associated with each of the processor links can be determined by calculating, for each of the processor links, an average of the performance measurements associated with the data lanes that constitute the processor link. The average performance measurements associated with each of the processor links can be compared and the processor link associated with the smallest average performance measurement can be selected as the victim processor link. The performance measurements associated with each of the data lanes of the victim processor link can then be compared to identify the victim data lane, as described above with reference to block 312 of FIG. 3. The flow continues at block 506.

A random data pattern is transmitted on the victim data lane and quiet data patterns are transmitted on other data lanes of the victim processor link and on each of the other processor links (block 506). Transmitting a random data pattern via a data lane comprises transmitting randomly generated data bits via the data lane. Transmitting a quiet data pattern via a data lane comprises transmitting data bits at logic zero (e.g., transmitting "0") via the data lane. To transmit a quiet data pattern on the other processor links that were not deemed to be the victim processor link, a logic zero data bit can be transmitted (at each clock cycle) on each data lane of each of the non-victim processor links. Assuming that a non-victim processor link comprises M data lanes, a 2M-bit random number (or a random number with another suitable bit length) can be generated. The 2M-bit random number can be masked with a 2M-bit all-zero AND mask to yield a 2M-bit quiet data pattern that can be transmitted across the processor links. As described above, the first M bits of the 2M-bit quiet data pattern can be mapped to the M data lanes of the processor link during the first clock cycle, the last M bits of the 2M-bit quiet data pattern can be mapped to the M data lanes of the processor link during the second clock cycle, first M bits of the 2M-bit quiet data pattern can be mapped again to the M data lanes of the processor link during the third clock cycle, and so on. It is noted that in other implementations, the quiet data pattern may be not be generated by applying an all-zero AND mask to a random number. Instead, the quiet data pattern may be directly generated to comprise data bits at logic zero.

Referring now to the victim processor link, a random data pattern is transmitted via the victim data lane and quiet data patterns are transmitted via each of the other data lanes of the victim processor link. For this, data bits at logic zero can be transmitted (at each clock cycle) on each non-victim data lane of the victim processor link and randomly generated data bits can be transmitted (at each clock cycle) on the victim data lane of the victim processor link. Assuming that the victim processor link comprises M data lanes, a 2M-bit random number (or a random number with another suitable bit length) can be generated. The data bits of the 2M-bit random number that map to the victim data lane can be identified. If the $3^{rd}$ data lane is the victim data lane, data bit 3 and data bit (M+3) of the 2M-bit random number map to the third data lane. A 2M-bit bit mask can be generated so that the data bits of the bit mask that map to the victim data lane (e.g., data bit 3 and data bit M+3) are at logic 1 and so that the other data bits of the bit mask are at logic 0. For example, if M=4, the 8-bit bit mask would be 00100010. An AND logic operation can be executed between the 2M-bit bit mask and the 2M-bit random number to yield a data pattern that comprises a random data pattern on the victim data lane and comprises a quiet data pattern on the other data lanes of the victim processor link.

It is noted that in other embodiments a random number with any suitable length (e.g., 4M, 8M, 16M, etc.) can be generated. For example, a 4M-bit random number can be generated. One or more data bits of the 4M-bit random number can be appropriately masked to generate the appropriate data pattern (e.g., a switching data pattern, a quiet data pattern, etc.). Varying the length of the data pattern that is to be repeated across groups of clock cycles can influence the phase/frequency of the data pattern, the duty cycle and the periodicity with which data bits are switched from logic zero to logic one and vice versa. For example, if the length of the data pattern is 2M bits, the data bits transmitted via a data lane may be switched between logic zero and logic one at each clock cycle, resulting in a duty cycle of 50%. As another example, if the length of the data pattern is 4M bits, the duty cycle can be decreased to 33% by transmitting (on a particular data lane) a logic zero data bit for 1 clock cycle and logic one data bits for the remaining 3 clock cycles. As another example, if the length of the data pattern is 4M bits, the duty cycle can be increased to 77% by transmitting (on a particular data lane) a logic one data bit for 1 clock cycle and logic zero data bits for the remaining 3 clock cycles. As another example, if the length of the data pattern is 4M bits, the duty cycle can be maintained at 50% by transmitting (on a particular data lane) logic one data bits for the first two consecutive clock cycles and logic zero data bits for the next 2 consecutive clock cycles. Thus, varying the length of the data pattern controls and varies the frequency and duty cycle according to which data bits on data lanes are switched. Varying the frequency and duty cycle can help control/vary the relative phase of the data pattern between different data lanes for identifying cross-talk between data lanes. The flow continues at block 508.

Performance measurements associated with the victim data lane are determined in response to transmitting the quiet data pattern on the other data lanes (block 508). In some implementations, data eye numbers (or other suitable performance measurements) associated with the victim data lane can be determined. The performance measurements associated with the victim data lane in the presence of a quiet data pattern on the other data lanes can enable determination of whether the poor performance measurements associated with the victim data lane can be attributed to interference between the victim data lane and another data lane. For example, if the data eye height associated with the victim data lane determined at block 508 (in response to transmitting the quiet data pattern on the other data lanes) is greater than the base data eye height associated with the victim data lane determined at block 502 (in response to transmitting the random data pattern), the presence of crosstalk can be inferred. In another implementation, the presence of crosstalk can be inferred if the data eye height based on the quiet data pattern is greater than the data eye height based on the random data pattern by a predetermined threshold (e.g., 25%). The flow continues at block 510.

A random data pattern is transmitted on the victim data lane and switching data patterns are transmitted on other data lanes of the victim processor link and on each of the other processor links (block 510). Transmitting a random data pattern via a data lane comprises transmitting randomly generated data bits via the data lane. Transmitting a switching data pattern via a data lane comprises transmitting a data bit at logic zero (e.g., transmitting "0") and transmitting a data bit at logic one (e.g., transmitting "1") via the same data lane on consecutively alternating clock cycles, as described above in block 314 of FIG. 3. To transmit a switching data pattern on the other processor links that were not deemed to be the victim (or the weakest) processor link, a data bit at logic zero and a data bit at logic one can be alternately transmitted (on each data lane that constitutes each of the non-victim processor links) during consecutive clock cycles. For a processor link that comprises M data lanes, a 2M-bit random number (or a random number with another suitable bit length) can be generated. A 2M-bit bit mask can be generated so that the first M bits of the 2M-bit bit mask are at logic zero and the last M bits of the 2M-bit bit mask are at logic one. AND logic operations can be executed between the 2M-bit bit mask and the 2M-bit random number so that the first M bits of the resultant 2M-bit number are at logic zero and the last M bits of the resultant 2M-bit number are unaffected. Next, OR logic operations can be executed between the 2M-bit bit mask and the modified 2M-bit number so that the first M bits of the 2M-bit number are unaffected and the last M bits of the 2M-bit number are at logic one. If M=4, then after the bit masking operations are executed, the switching data pattern is of the form 00001111. As described above, the first M bits of the resultant 2M-bit switching data pattern can be mapped to the M data lanes of the processor link during the first clock cycle, the last M bits of the 2M-bit switching data pattern can be mapped to the M data lanes of the processor link during the second clock cycle, the first M bits of the 2M-bit switching data pattern can be mapped again to the M data lanes of the processor link during the third clock cycle, and so on. It is noted that in other implementations, the switching data pattern may be not be generated by applying the above described AND mask and OR mask to a random number. Instead, the switching data pattern may be directly generated to comprise data bits at logic zero and at logic one during consecutive clock cycles.

Referring now to the victim processor link, a random data pattern is transmitted on the victim data lane and switching data patterns are transmitted on the other data lanes of the victim processor link. For this, data bits at logic zero and at logic one can be alternately transmitted (at each clock cycle) on each non-victim data lane of the victim processor link and randomly generated data bits can be transmitted (at each clock cycle) on the victim data lane of the victim processor link. The operations of block 314 of FIG. 3 can be executed to yield a data pattern that comprises a random data pattern on the victim data lane and comprises a switching data pattern on the other data lanes of the victim processor link. In some implementations, the switching data pattern may be transmitted on the other data lanes only if transmitting the quiet data pattern on the other (non-victim) data lanes did not affect the performance measurements associated with the victim data lane. In another implementation, the switching data pattern may be transmitted on the other data lanes irrespective of whether transmitting the quiet data pattern on the other (non-victim) data lanes affected the performance measurements associated with the victim data lane. As will be described below in block 512, the switching data pattern may be transmitted on the other data lanes to detect or to confirm the presence of crosstalk on the victim data lane. The flow continues at block 512.

Performance measurements associated with the victim data lane are determined in response to transmitting the switching data pattern on the other data lanes (block 512). In some implementations, data eye numbers (or other suitable performance measurements) associated with the victim data lane can be determined. The performance measurements associated with the victim data lane in the presence of a switching data pattern on the other data lanes can enable determination (or confirmation) of whether the poor performance measurements associated with the victim data lane can be attributed to interference between the victim data lane and another data lane. For example, if the data eye height associated with the victim data lane determined at block 512 (in response to transmitting the switching data pattern on the other data lanes) is approximately equal to (within a predetermined threshold of say, 25%) the base data eye height associated with the victim data lane determined at block 502 (in response to transmitting the random data pattern), the presence of crosstalk on the victim data lane can be inferred. The flow continues at block 514.

Responsive to detecting a variation in performance measurements based on transmitting the quiet data pattern and the switching data pattern on the other data lanes, the presence of crosstalk on the victim data lane due to one or more other data lanes is determined (block 514). As described above with reference to blocks 508 and 512, the data eye numbers associated with the victim data lane based on transmitting a random data pattern (at block 502), a quiet data pattern (at block 506), and a switching data pattern (at block 510) on the other data lanes can be compared against each other. For the victim data lane, the data eye numbers based on transmitting the switching data pattern being approximately equal to or less than the data eye numbers based on transmitting the random data pattern can indicate the presence of crosstalk on the victim data lane. For the victim data lane, the data eye numbers based on transmitting the quiet data pattern being greater than the data eye numbers based on transmitting the random data pattern can indicate the presence of crosstalk on the victim data lane. The flow continues at block 516 in FIG. 6.

Excluding the victim processor link, a quiet data pattern is transmitted on a first subset of the plurality of processor links and a switching data pattern is transmitted on the second subset of the plurality of processor links (block 516 in FIG. 6). Binary search operations can be executed across the processor links within the system to identify an aggressor processor link that interferes with the victim processor link, as will be described below in blocks 516-528. A random data pattern can be transmitted on all the data lanes of the victim processor link. Excluding the victim processor link, if the system comprises N processor links, a quiet data pattern (i.e., wherein all the data bits are at logic zero) is transmitted on all the data lanes that constitute N/2 of the processor links (i.e., the first subset of the processor links). A switching data pattern (i.e., wherein data bits are alternately at logic zero and at logic one during consecutive clock cycles) is transmitted on all the data lanes that constitute the remaining N/2 processor links (i.e., the second subset of the processor links). The flow continues at block 518.

Performance measurements associated with the victim processor link are determined (block 518). In some implementations, only the data eye numbers associated with the victim data lane may be determined. In another implementation, the data eye numbers associated with all the data lanes that constitute the victim processor link may be determined. As will be further described below, the data eye numbers associated with the victim processor link can be compared against the corresponding base data eye numbers (determined at block 502 of FIG. 5) to zero in on the aggressor processor link that is interfering with the victim processor link. The flow continues at block 520.

It is determined whether the performance measurements associated with the victim processor link are better than the base performance measurements associated with the victim processor link (block 520). In some implementations, only the data eye numbers associated with the victim data lane may be compared against the base data eye numbers associated with the victim data lane. In another implementation, for each data lane of the victim processor link, the data eye numbers determined at block 520 can be compared against the corresponding base data eye numbers. In another implementation, average data eye numbers associated with the victim processor link can be compared against average base data eye numbers associated with the victim processor link. An increase or a decrease in the data eye numbers determined at block 520 as compared to the base eye numbers can indicate whether the quiet data pattern or the switching data pattern was transmitted on the aggressor processor link, as will be further described below. The flow continues at block 522.

It is determined that the crosstalk on the victim processor link is being caused by at least one processor link of the first subset of processor links on which the quiet data pattern was transmitted (block 522). The flow 500 moves from block 520 to block 522 if it is determined that the performance measurements associated with the victim processor link are better than the corresponding base performance measurements associated with the victim processor link. For example, if the data eye numbers (e.g., the data eye width and/or the data eye height) determined at block 520 is greater than the base data eye numbers (e.g., by a predetermined threshold), it may be inferred that the interference on the victim processor link was being caused by a processor link that was disabled (e.g., a processor link on which the quiet data pattern was transmitted). In some implementations, to confirm this inference, the quiet data pattern can be transmitted on the N/2 processor links (the second subset of processor links) on which the switching data pattern was previously transmitted at block 516. Likewise, the switching data pattern can be transmitted on the N/2 processor links (the first subset of processor links) on which the quiet data pattern was previously transmitted at block 516. The flow continues at block 526.

It is determined that the crosstalk on the victim data lane is being caused by at least one processor link of the second subset of processor links on which the switching data pattern was transmitted (block 524). The flow 500 moves from block 520 to block 524 if it is determined that the performance measurements associated with the weakest data lane are approximately equal to or worse than the last determined performance measurements associated with the victim processor link. For example, if the data eye numbers (e.g., the data eye width and/or the data eye height) determined at block 520 is approximately equal to (e.g., within a predetermined threshold of) the base data eye numbers, it may be inferred that the interference on the victim processor link is being caused by a processor link that was not disabled (e.g., a processor link on which the switching data pattern was transmitted). The flow continues at block 526.

It is determined whether the aggressor processor link for the weakest processor link is identified (block 526). If it is determined that additional iterations of the binary search procedure described above in blocks 516-524 should be executed to identify the aggressor processor link, the flow continues at block 528. If it is determined that the aggressor processor link has been identified and that additional iterations of the binary search procedure need not be executed, the flow continues at block 530 in FIG. 7.

The subset of the processor links that was deemed to interfere with the victim processor link are selected for analysis (block 528). The flow 500 moves from block 526 to block 528 if the aggressor processor link for the weakest data lane was not identified during the previous iteration. If it was determined at block 520 that the crosstalk on the victim processor link is being caused by the first subset of processor links on which the quiet data pattern was transmitted, the first subset of processor links can be selected for subsequent analysis. After the flow loops back to block 516 from block 528, a switching data pattern can be transmitted on half of the first subset of processor links, a quiet data pattern can be transmitted on the other half of the first subset of processor links, and the quiet data pattern can also be transmitted on the second subset of processor links that were deemed to not interfere with the victim processor link. If it was determined at block 520 that the crosstalk on the victim processor link is being caused by the second subset of processor links on which the switching data pattern was transmitted, the second subset of processor links can be selected for subsequent analysis. After the flow loops back to block 516 from block 528, a switching data pattern can be transmitted on half of the second subset of processor links, a quiet data pattern can be transmitted on the other half of the second subset of processor links, and the quiet data pattern can also be transmitted on the first subset of processor links that were deemed to not interfere with the victim processor link. The operations described above in blocks 516-528 can be executed until the interference on the victim processor link can be attributed to a particular aggressor processor link. From block 528, the flow loops back to block 516.

For the identified aggressor processor link, binary search procedures are executed to identify an aggressor data lane of the aggressor processor link that interferes with the victim data lane by transmitting a quiet data pattern or a switching data pattern on one or more data lanes of the aggressor processor link (block 530 in FIG. 7). The flow 500 moves from block 526 in FIG. 6 to block 530 in FIG. 7 after the aggressor processor link is identified. At block 530, a quiet data pattern may be transmitted on half of the data lanes that constitute the aggressor processor link and a switching data pattern may be transmitted on the other half of the data lanes that constitute the aggressor processor link. A random data pattern may be transmitted on the victim data lane. Either a random or a quiet data pattern may be transmitted on the other data lanes of the victim processor link and the other processor links. The performance measurements associated with the victim data lane can be compared against the base performance measurements (determined at block 502) associated with the victim data lane to zero in on the aggressor data lane. After executing one or more iterations of the binary search procedure, the aggressor data lane can be identified from the aggressor processor link. The flow continues at block 532.

Based on knowledge of the victim data lane and the aggressor data lane, a physical location on the system where the aggressor data lane interferes with the victim data lane is identified (block 532). In other words, based on knowledge of the aggressor data lane, the corresponding aggressor processor link, the victim data lane, and the corresponding victim processor link, physical constructs or a physical arrangement of the data lanes may be linked to the affinity between the aggressor data lane and the victim data lane. For example, it may be determined that aggressor data lane 4 of processor link 1 is interfering with victim data lane 32 of processor link 3. A hardware database or other suitable functionality can be employed to establish a nexus between the interference between the two data lanes and the physical construction of the system. Based on the hardware database (or other suitable functionality), it may be determined that the interference is being caused because the aggressor data lane 4 of processor link 1 is in close proximity to the victim data lane 32 of processor link 3 on the circuit board. More generically, based on knowledge of the aggressor data lane and the victim data lane, the physical location within the system (e.g., whether on the board level, the package level, the pin/connector level, etc.) at which the signal from the aggressor data lane couples with the signal from the victim data lane can be identified. The flow continues at block 534.

One or more aspects of the system are redesigned to minimize interference between the victim data lane and the aggressor data lane (block 534). For example, the physical constructs and/or the physical arrangement of one or more components of the system can be redesigned to minimize/eliminate the affinity between the aggressor data lane and the victim data lane. From block 534, the flow ends.

It should be understood that FIGS. 1-7 are examples meant to aid in understanding embodiments and should not be used to limit embodiments or limit scope of the claims. Embodiments may perform additional operations, fewer operations, operations in a different order, operations in parallel, and some operations differently. For instance, FIGS. 1-7 describe operations for characterizing processor links and isolating affinity between processor links in a multi-processor system. However, in other embodiments, the operations described herein can be executed for any suitable high-speed communication links. For example, the operations described herein can be executed to characterize (and/or isolate affinity between) communication links between a processor and an ASIC. As another example, the operations described herein can be executed to characterize processor links that couple processors on different systems.

In some embodiments, after the presence of crosstalk on the victim data lane is detected, the aggressor data lane can be identified based on executing binary search operations across all of the other processor links and data lanes, as described above in FIGS. 2 and 5-7. However, embodiments are not so limited. In other embodiments, a hardware database that indicates potential interactions between data lanes at various levels of the system may be maintained. For example, for each data lane, the hardware database may indicate other data lanes that could potentially interfere with the data lane under consideration at the package level, the connector level, etc. Thus, after the victim data lane is identified, the hardware database can be accessed and the other data lanes that could potentially interfere with the victim data lane ("potential aggressor data lanes") can be identified. In some implementations, the potential aggressor data lanes can be analyzed individually (e.g., by transmitting a random data pattern on the victim data lane, transmitting a switching data pattern on the potential aggressor data lane, and transmitting a quiet data pattern on all the other data lanes) to identify the aggressor data lane that causes the maximum interference on the victim data lane. In other implementations, the potential aggressor data lanes can be analyzed using the binary search techniques described above to identify the aggressor data lane that causes the maximum interference on the victim data lane.

It is noted that although FIGS. 2 and 5-7 describe binary search procedures being executed to identify the aggressor processor link and the aggressor data lane, embodiments are not so limited. In other embodiments, other suitable techniques can be employed to identify the aggressor processor link and the aggressor data lane. For example, the data pattern transmitted via the processor links can be configured on a bit-by-bit basis to individually test the effect of each processor link (and data lane) on the victim processor link (and victim data lane). Furthermore, in some implementations, the aggressor processor link may not be identified prior to identifying the aggressor data lane. Instead, excluding the victim data lane, binary search procedures can be executed across all of the data lanes (associated with all of the processor links) to directly identify the aggressor data lane.

It is noted that in some implementations, the processor link characterization operations of FIGS. 1 and 3-4 can be executed periodically (e.g., every two years) in the actual environment (e.g., the environment in which the system is deployed) to re-train the processor links and to account for (or compensate for) aging of the processor links and other components of the system. The operations described herein can be re-executed to identify, for the processor links, the best I/O parameters associated with the driver processor and the destination processor to ensure reliable communication via the processor links.

It is noted that although FIGS. 1-7 describe transmitting the random data pattern, the switching data pattern, and/or the quiet data pattern on one or more data lanes to characterize the processor link and establish I/O parameters, and/or to identify affinity between a victim data lane and an aggressor data lane, embodiments are not so limited. In other embodiments, other suitable data patterns can be generated (e.g., by applying suitable bit masks) and used for validating the data lanes. For example, data patterns that simulate failure or degradation of one or more data lanes within a processor link can be employed to test the effect of data lane failure on the other active data lanes of the processor link. As another example, data patterns that simulate failure or degradation of one or more processor links can be employed to test the effect of processor link failure on the other active processor links of the system.

It is noted that although FIGS. 2 and 5-7 describe the aggressor processor link being different from the victim processor link, embodiments are not so limited. In other embodiments, while executing the binary search procedures to identify the aggressor processor link, it may be determined that the performance measurements associated with the victim processor link remain almost constant (within a predetermined threshold) irrespective of whether a switching data pattern or a quiet data pattern is transmitted via the other processor links. If an aggressor processor link cannot be identified from the other processor links (i.e., those that are not the victim processor link), it can be inferred that the aggressor processor link is the same as the victim processor link. In other words, it may be inferred that a data lane of the victim processor link is interfering with another data lane (i.e., the victim data lane) of the victim processor link. In this embodiment, operations described above with reference to block 530 in FIG. 7 can be executed to identify the aggressor data lane from the victim processor link.

Lastly, in some implementations, each processor link can be associated with one or more clock signals and each clock signal can be associated with a predetermined number of data signals. In other words, the number of clock signals associated with the processor link may depend on the number of data lanes that constitute the processor link. In one example, each clock signal may be associated with 16 data lanes. Thus, a 64-bit processor link (i.e., a processor link that comprises 64 data lanes) may be associated with 4 clock signals where each clock signal controls data transmission via 16 of the data lanes. A data bit may be transmitted on each subset of the 16 data lanes at the rising edge (or the falling edge) of the corresponding clock signal. For example, at the rising edge of the first clock signal, 16 data bits may be mapped onto the 16 data lanes associated with the first clock signal. At the at the rising edge of the second clock signal, 16 data bits may be mapped onto the next 16 data lanes associated with the second clock signal, and so on. It is noted that in other examples, the number of data lanes per processor link and the number of clock signals associated with each processor link may depend on the configuration and design of the system. Furthermore, in some implementations, each of the clock signals may be synchronized with each other. In other implementations, subsets of the clock signals may be synchronized with each other. In other implementations, one or more of the clock signals may be staggered with respect to each other.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 8:
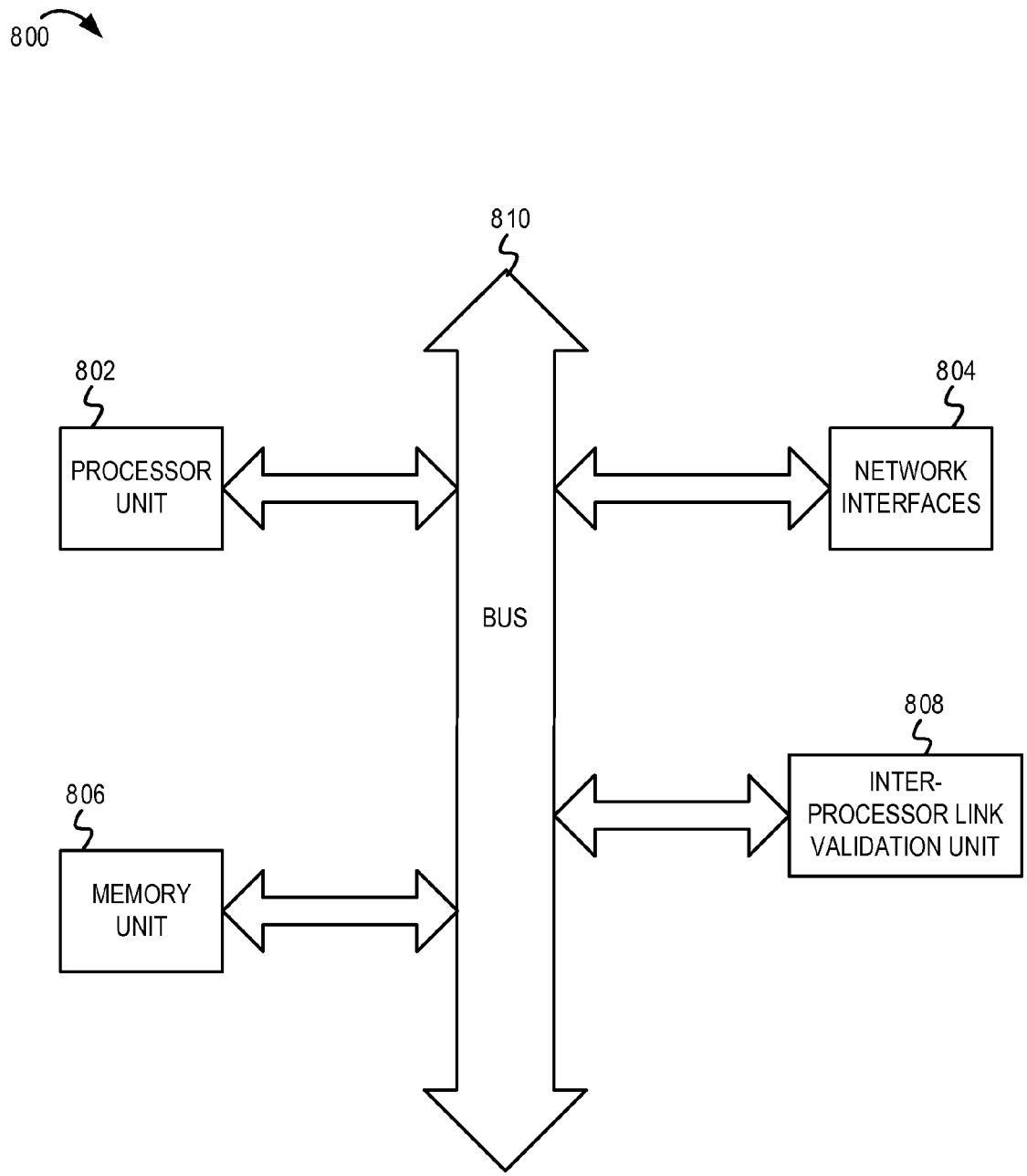
FIG. 8 depicts an electronic device including a mechanism for characterization and validation of processor links.

FIG. 8 is a block diagram of one embodiment of an electronic system 800 including a mechanism for characterization and validation of processor links in a test environment. The electronic system 800 includes a processor unit 802 (possibly including multiple processors, multiple cores, multiple nodes, and/or implementing multi-threading, etc.). The electronic system 800 includes a memory unit 806. The memory unit 806 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The electronic system 800 also includes a bus 810 (e.g., PCI, ISA, PCI-Express, HyperTransport®, Infini-Band®, NuBus, AHB, AXI, etc.), and network interfaces 804 that include at least one of a wireless network interface (e.g., a WLAN interface, a Bluetooth® interface, a WiMAX interface, a ZigBee® interface, a Wireless USB interface, etc.) and a wired network interface (e.g., an Ethernet interface, an ATM interface, a Frame Relay interface, SONET interface, etc.). The processor unit 802, the memory unit 806, and the network interfaces 804 are coupled to the bus 810.

In some implementations, the electronic system 800 may be a circuit board, a system on a chip, an interconnection of one or more integrated circuits, or other suitable electronic systems. The electronic system 800 also includes an inter-processor link validation unit 808. The inter-processor link validation unit 808 can implement functionality to force customizable data patterns from an operating system layer of the system 800 for characterizing a processor link between a driver processor and a destination processor of the processor unit 802 and for identifying I/O parameters associated with the driver processor and the destination processor to for reliable data communication via the processor link, as described above in accordance with FIGS. 1 and 3-4. The inter-processor link validation unit 808 can also implement functionality for isolating the affinity between processor links) between pairs of processors in the processor unit 802), as described above with reference to FIGS. 2 and 5-7.

Although FIG. 8 depicts the inter-processor link validation unit 808 being implemented as part of the electronic system 800, it is noted that in other implementations, the inter-processor link validation unit 808 can be embodied on a distinct circuit board (or integrated circuit) and may be externally coupled with the processor unit 802 and/or the electronic system 800. Any one of these functionalities may be partially (or entirely) implemented in hardware and/or on the processor unit 802. For example, the functionality may be implemented with an application specific integrated circuit, in logic implemented in the processor unit 802, in a co-processor on a peripheral device or card, etc. Further, realizations may include fewer or additional components not illustrated in FIG. 8 (e.g., video cards, audio cards, additional network interfaces, peripheral devices, etc.). Although illustrated as being coupled to the bus 810, the memory unit 806 may be coupled to the processor unit 802.

While the embodiments are described with reference to various implementations and exploitations, it will be understood that these embodiments are illustrative and that the scope of the inventive subject matter is not limited to them. In general, techniques for characterization and validation of processor links as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. One or more non-transitory machine-readable storage media having stored therein a program product, which when executed by a set of one or more processors causes the set of one or more processors to perform operations that comprise:
   selecting a first of a plurality of processor links that couples a first of a plurality of processors and a second of the plurality of processors,
      wherein said operation of selecting the first of the plurality of processor links comprises providing a first data pattern from the first of the plurality of processors to the second of the plurality of processors via the first of the plurality of processor links,
         wherein the first data pattern is a random data pattern that comprises a random combination of data bits, and
         wherein said operation of providing the first data pattern comprises mapping a plurality of data bits that constitute the first data pattern to corresponding ones of the plurality of physical data lanes that constitute the first of the plurality of processor links;
   identifying a plurality of communication parameter settings associated with the first of the plurality of processors and the second of the plurality of processors;
   for each of the plurality of communication parameter settings,
      configuring the first of the plurality of processors and the second of the plurality of processors with the communication parameter setting that governs data communication from the first of the plurality of processors to the second of the plurality of processors via the first of the plurality of processor links;
      providing, in accordance with the communication parameter setting, a test data pattern from the first of the plurality of processors to the second of the plurality of processors via the first of the plurality of processor links;
      determining a performance measurement associated with the first of the plurality of processor links and with the communication parameter setting based, at least in part, on the test data pattern as received at the second of the plurality of processors;
   comparing the performance measurements associated with the each of the plurality of communication parameters settings;
   identifying a highest of the performance measurements based, at least in part, on said comparing the performance measurements of the each of the plurality of communication parameters settings, wherein the highest of the performance measurements was determined for a first of the plurality of communication parameter settings; and
   applying the first of the plurality of communication parameter settings to the first of the plurality of processors and the second of the plurality of processors.

2. The non-transitory machine-readable storage media of claim 1, wherein said operation of selecting the first of the plurality of processor links that couples the first of the plurality of processors in the system and the second of the plurality of processors further comprises:
   configuring the first of the plurality of processors and the second of the plurality of processors with an initial communication parameter setting that governs data communication via the first of the plurality of processor links, wherein
      the first data pattern is provided in accordance with the initial communication parameter setting;
   and
   determining a performance measurement associated with the first of the plurality of processor links and the initial communication parameter setting based, at least in part, on the first data pattern as received at the second of the plurality of processors.

3. The non-transitory machine-readable storage media of claim 2,
   wherein the first of the plurality of processor links comprises a plurality of physical data lanes between the first of the plurality of processors and the second of the plurality of processors; and
   wherein said operation of determining the performance measurement associated with the first of the plurality of processor links and the initial communication parameter setting based, at least in part, on the first data pattern as received at the second of the plurality of processors comprises:
      determining a performance measurement associated with each of the plurality of data lanes that constitutes the first of the plurality of processor links; and
      identifying a first of the plurality of data lanes that has a smallest of the performance measurements.

4. A system comprising:
   a plurality of processors; and
   an inter-processor link validation unit coupled with the plurality of processors, the inter-processor link validation unit operable to:
      select a first of a plurality of processor links that couples a first of the plurality of processors and a second of the plurality of processors,
         wherein the inter-processor link validation unit is operable to perform the operation of selecting the first of the plurality of processor links at least by providing a first data pattern from the first of the plurality of processors to the second of the plurality of processors via the first of the plurality of processor links, wherein the first data pattern is a random data pattern that comprises a random combination of data bits, and wherein the inter-processor link validation unit is operable to perform the operation of providing the first data pattern at least by mapping a plurality of data bits that constitute the first data pattern to corresponding ones of the plurality of physical data lanes that constitute the first of the plurality of processor links;

identify a plurality of communication parameter settings associated with the first of the plurality of processors and the second of the plurality of processors;

for each of the plurality of communication parameter settings, configure the first of the plurality of processors and the second of the plurality of processors with the communication parameter setting that governs data communication from the first of the plurality of processors to the second of the plurality of processors via the first of the plurality of processor links;

provide, in accordance with the communication parameter setting, a test data pattern from the first of the plurality of processors to the second of the plurality of processors via the first of the plurality of processor links;

determine a performance measurement associated with the first of the plurality of processor links and with the communication parameter setting based, at least in part, on the test data pattern as received at the second of the plurality of processors;

compare the performance measurements associated with each of the plurality of communication parameters settings;

identify a highest of the performance measurements based, at least in part, on the inter-processor link validation unit comparing the performance measurements of the each of the plurality of communication parameters settings, wherein the highest of the performance measurements was determined for a first of the plurality of communication parameter settings; and apply the first of the plurality of communication parameter settings to the first of the plurality of processors and the second of the plurality of processors.

5. The system of claim 4, wherein the inter-processor validation unit comprises one or more machine readable store media.

6. The non-transitory machine-readable storage media of claim 3, wherein said operation of comparing the performance measurements associated with each of the plurality of communication parameter settings comprises:

comparing, across each of the plurality of communication parameter settings, a performance measurements of the first of the plurality of data lanes; and wherein said operation of identifying the highest of the performance measurements comprises:

identifying a highest of the performance measurements based, at least in part, on said comparing the performance measurements of each of the plurality of data lanes, wherein the highest of the performance measurements was determined for the first of the plurality of communication parameter setting and the first of the plurality of data lanes.

7. The system of claim 4, wherein the inter-processor link validation unit is operable to perform the operation of selecting the first of the plurality of processor links at least by:

configuring the first of the plurality of processors and the second of the plurality of processors with an initial communication parameter setting that governs data communication via the first of the plurality of processor links, wherein the first data pattern is provided in accordance with the initial communication parameter setting; and determining a performance measurement associated with the first of the plurality of processor links and the initial communication parameter setting based, at least in part, on the first data pattern as received at the second of the plurality of processors.

8. The system of claim 7, wherein the first of the plurality of processor links comprises a plurality of physical data lanes between the first of the plurality of processors and the second of the plurality of processors; and wherein the inter-processor link validation unit is operable to perform the operation of determining the performance measurement associated with the first of the plurality of processor links and the initial communication parameter setting at least by:

determining a performance measurement associated with each of the plurality of data lanes that constitutes the first of the plurality of processor links, and identifying a first of the plurality of data lanes that has a smallest of the performance measurements.

\* \* \* \* \*